(12) United States Patent
Dewey et al.

(10) Patent No.: US 11,929,320 B2
(45) Date of Patent: Mar. 12, 2024

(54) TOP GATE RECESSED CHANNEL CMOS THIN FILM TRANSISTOR IN THE BACK END OF LINE AND METHODS OF FABRICATION

(71) Applicant: Intel Corporation, Santa Clara, CA (US)

(72) Inventors: Gilbert Dewey, Hillsboro, OR (US); Ryan Keech, Portland, OR (US); Cory Bomberger, Portland, OR (US); Cheng-Ying Huang, Hillsboro, OR (US); Ashish Agrawal, Hillsboro, OR (US); Willy Rachmady, Beaverton, OR (US); Anand Murthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/709,032

(22) Filed: Mar. 30, 2022

(65) Prior Publication Data
US 2022/0223519 A1     Jul. 14, 2022

Related U.S. Application Data

(63) Continuation of application No. 16/728,887, filed on Dec. 27, 2019, now Pat. No. 11,328,988.

(51) Int. Cl.
*H01L 29/74* (2006.01)
*H01L 21/762* (2006.01)
(Continued)

(52) U.S. Cl.
CPC .... *H01L 23/5226* (2013.01); *H01L 21/76251* (2013.01); *H01L 21/76804* (2013.01); *H01L 27/1203* (2013.01)

(58) Field of Classification Search
CPC ........... H01L 23/5226; H01L 21/76804; H01L 21/76251; H01L 27/1203; H01L 23/485; H01L 29/41733; H01L 29/78696
See application file for complete search history.

(56) References Cited

U.S. PATENT DOCUMENTS 6,646,287 B1    11/2003   Ono et al.
9,368,512 B1    6/2016    Cheng et al.
(Continued)

FOREIGN PATENT DOCUMENTS

CN           105448727          3/2016

OTHER PUBLICATIONS

Notice of Allowance from U.S. Appl. No. 16/728,887 dated Jan. 7, 2022, 9 pgs.
(Continued)

*Primary Examiner* — Ismail A Muse
(74) *Attorney, Agent, or Firm* — Essential Patents Group, LLP

(57) ABSTRACT

A device includes a device level having a metallization structure coupled to a semiconductor device and a transistor above the device level. The transistor has a body including a single crystal group III-V or group IV semiconductor material, a source structure on a first portion of the body and a drain structure on a second portion of the body, where the source structure is separate from the drain structure. The transistor further includes a gate structure including a first gate structure portion in a recess in the body and a second gate structure portion between the source structure and the drain structure. A source contact is coupled with the source structure and a drain contact is coupled with the drain structure. The source contact is in contact with the metallization structure in the device level.

19 Claims, 14 Drawing Sheets

(51) Int. Cl.
*H01L 21/768* (2006.01)
*H01L 23/522* (2006.01)
*H01L 27/12* (2006.01)

(56) References Cited

U.S. PATENT DOCUMENTS

| | | |
|---|---|---|
| 9,685,436 B2 | 6/2017 | Morrow et al. |
| 9,711,501 B1 | 7/2017 | Basker et al. |
| 2004/0007724 A1 | 1/2004 | Murthy et al. |
| 2004/0065882 A1 | 4/2004 | Yamazaki et al. |
| 2006/0186398 A1 | 8/2006 | Hsieh et al. |
| 2010/0163926 A1 | 7/2010 | Hudait et al. |
| 2013/0154016 A1 | 6/2013 | Glass et al. |
| 2013/0187198 A1 | 7/2013 | Camillo-Castillo et al. |
| 2013/0270512 A1 | 10/2013 | Radosavljevic et al. |
| 2015/0021771 A1 | 1/2015 | Lin |
| 2016/0322503 A1* | 11/2016 | Tezuka ............... H01L 27/127 |
| 2018/0090582 A1 | 3/2018 | Adusumilli et al. |
| 2018/0130785 A1 | 5/2018 | Wang et al. |
| 2018/0145135 A1 | 5/2018 | Zhang |
| 2018/0308850 A1 | 10/2018 | Kang et al. |
| 2018/0331232 A1 | 11/2018 | Frougier et al. |
| 2019/0035889 A1 | 1/2019 | Mohapatra et al. |
| 2019/0348540 A1 | 11/2019 | Pillarisetty et al. |
| 2020/0126987 A1 | 4/2020 | Rubin et al. |
| 2020/0135930 A1 | 4/2020 | Passlack et al. |
| 2021/0036023 A1 | 2/2021 | Agrawal et al. |

OTHER PUBLICATIONS

Restriction Requirement from U.S. Appl. No. 16/728,887 dated Sep. 17, 2021, 6 pgs.

* cited by examiner

TOP GATE RECESSED CHANNEL CMOS THIN FILM TRANSISTOR IN THE BACK END OF LINE AND METHODS OF FABRICATION

CLAIM OF PRIORITY

This application is a continuation of, and claims the benefit of priority to, U.S. patent application Ser. No. 16/728,887, filed on Dec. 27, 2019 and titled "TOP GATE RECESSED CHANNEL CMOS THIN FILM TRANSISTOR IN THE BACK END OF LINE AND METHODS OF FABRICATION," which is incorporated by reference in its entirety for all purposes.

BACKGROUND

Generally, transistors are an important basis of modern electronics. Increasing transistor density in a wafer is highly desirable from a cost perspective. However, increasing the number of transistors is juxtaposed with increasing peripheral circuit elements. Stacking peripheral circuit elements including transistors, memory and repeater circuits, for example, above scaled high performance CMOS transistors can enable formation of microprocessors with increased functionality in a smaller package.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
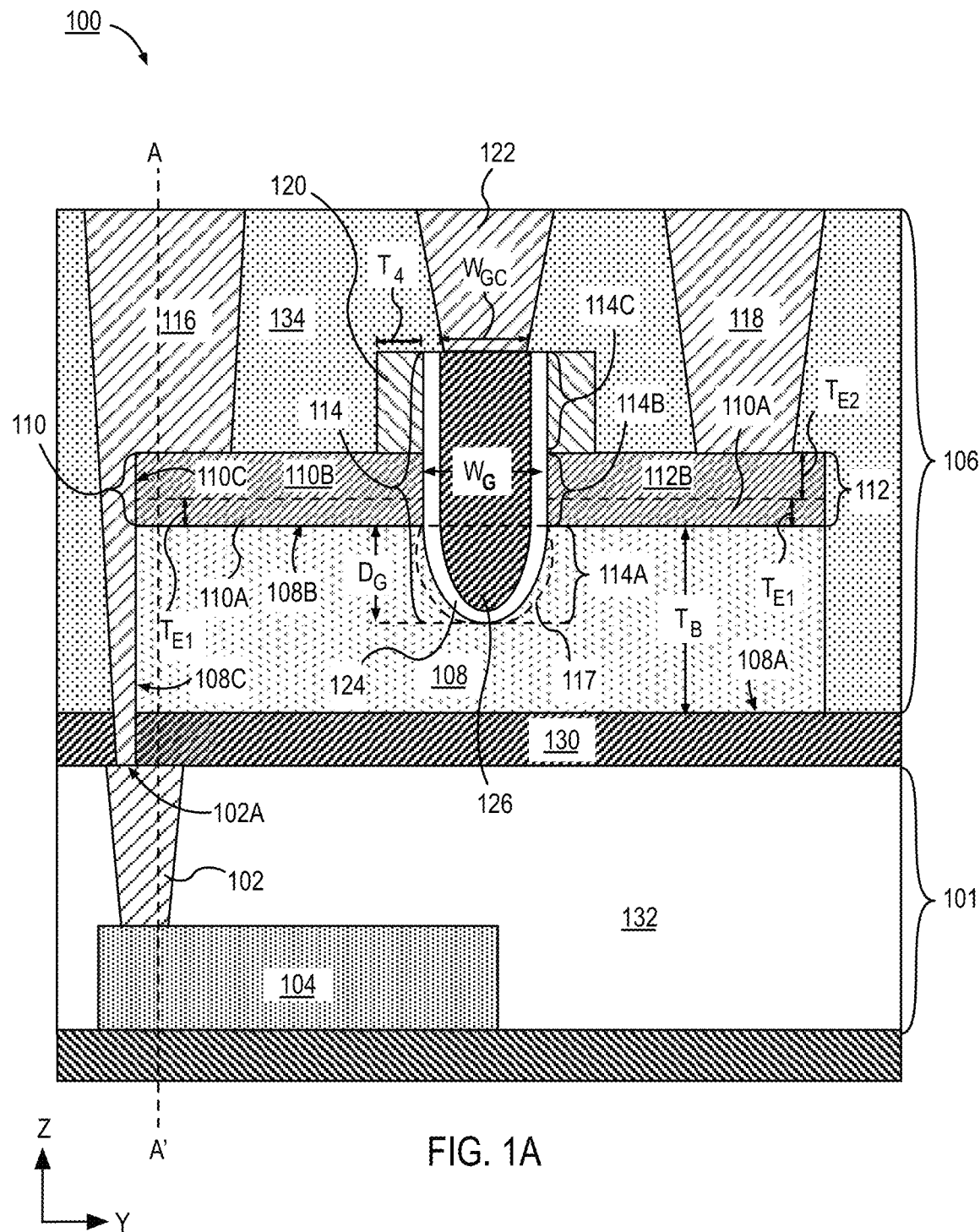
FIG. 1A illustrates a cross-sectional view of a recessed channel transistor coupled with a device below the recessed channel transistor, in accordance with an embodiment of the present disclosure.

A top gate recessed channel CMOS thin film transistor and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Stacking of peripheral circuits above scaled transistors can present challenges that may stem from physical, thermal and material incompatibilities. Physical incompatibilities may arise from differences in size between scaled logic transistors on a first level and peripheral circuit elements on a second level. Other issues of incompatibility can stem from limitations in materials that are utilized for fabricating peripheral circuit elements above a level of CMOS transistors. In many instances, peripheral structures utilize single crystal materials that are formed at temperatures that can far exceed temperature tolerances of already formed CMOS transistors. Peripheral circuits may have a higher operational voltage requirement than CMOS transistors and require further structural engineering to confine them to a physical space above the CMOS transistors, for example.

One method of overcoming one or more of the challenges discussed above is to stack a prefabricated peripheral circuit component above one or more CMOS transistors, for example. Such stacking can be accomplished by bonding a substrate including one or more CMOS transistors with a second substrate including a peripheral circuit. However, such methods impose strict alignment requirements on structures in substrate with structures of another substrate.

For ease of fabrication, it is desirable to fabricate a peripheral circuit element directly above a MOS transistor. However, the peripheral circuit element may include a transistor having a single crystal channel material. By bonding a wafer substrate including a blanket layer of single crystal material above one or more MOS transistors can offer the flexibility in the fabrication process. Such flexibility can be availed because bonding a substrate including a blanket material above a substrate including one or more prefabricated transistors require no specific alignment between the two substrates during the bonding process. The peripheral circuit element can then be fabricated after the bonding process is complete. Such a method is advantageous when peripheral circuit elements can be formed in the second substrate at process temperatures that do not cause electrical failure of MOS transistors in the first substrate (below the second substrate), for example. When a peripheral circuit element is directly above a MOS transistor, one of the terminals of the peripheral circuit element may extend below into an uppermost portion of the first substrate and electrically couple with a terminal of the MOS transistor.

In some examples, the peripheral circuit element includes long channel device such as a long channel transistor having a single crystal channel material. An example of such a long channel device is a recessed channel transistor. A recessed channel transistor has an advantage that a longer gate length can be fashioned by recessing a portion of the channel material and forming a portion of a gate in the recessed portion and a portion of the gate above the recessed portion. The gate length of a recessed channel transistor can be tuned without increasing a physical dimension of the transistor. By tuning a thickness of the channel material, a maximum recess in channel material can be adjusted. In accordance with an embodiment of the present disclosure a recessed channel transistor includes source and drain structures above the channel material, where the source and drain structures include an undoped region and a partially doped above the undoped region. By controlling the thickness of the undoped layer, an effective gate length of the transistor can be further modulated independent of an amount of recess in the channel material. Depending on embodiments, a layer for the source and drain structures may be formed before or after stacking two substrates together providing further flexibility during fabrication process. Such recessed channel transistors can be single MOS or CMOS architecture as desired. Further device elements such as resistive random-access memory devices or magnetic tunnel junction devices may be integrated with recessed channel transistors in some embodiments.

In other embodiments, the recessed channel transistor may be electrically coupled with more than one MOS transistor in the first substrate. For example, the first substrate may be, for instance, an integrated circuit die including two or more transistors. The second substrate may be, for instance, a memory module, a computer motherboard, or another integrated circuit die.

FIG. 1A illustrates a device 100 including a device level 101 having a metallization structure 102 coupled to a semiconductor device 104 and a transistor 106 above the device level 101. The transistor 106 has a body 108 including a single crystal group III-V or group IV semiconductor material, a source structure 110 on a first portion of the body 108 and a drain structure 112 on a second portion of the body 108, where the source structure 110 is separate from the drain structure 112. The transistor 106 further includes a gate structure 114 including a first gate structure portion 114A in a recess in the body 108 and a second gate structure portion 114B between the source structure 110 and the drain structure 112. A source contact 116 is coupled with the source structure 110 and a drain contact 118 is coupled with the drain structure 112. As shown, the source contact 116 is in contact with the metallization structure 102 in the device level 101. In other embodiments, the drain contact 118 is in contact with the metallization structure 102.

The body 108 has a thickness, $T_B$, in Z-direction as measured from lowermost body surface 108A. The thickness, $T_B$, changes gradually in the vicinity of the gate structure portion 114A. A maximum thickness $T_{BMAX}$, ranges between 10 nm and 30 nm in most embodiments, where $T_{BMAX}$ is defined as a vertical distance between surfaces 108A and 108B. $T_{BMAX}$ limits a maximum recess in the body 108. In an embodiment, body 108 includes silicon, germanium, silicon germanium and compound III-V binary and ternary semiconductor materials. Examples of compound III-V binary and ternary semiconductor materials include InP, GaN, GaAs, InN, InSb, GaSb, InAs or InGaAs. In an exemplary embodiment, the body 108 is undoped.

The shape of the gate structure portion 114A determines an effective gate length, $L_{EFF}$, of the transistor 106. More specifically in the cross-sectional illustration, $L_{EFF}$, is determined by the portion of the gate structure 114A that is in contact with the body 108. In the illustrative embodiment, the gate structure portion 114A has a semicircular shape. The gate structure portion 114A has a depth $D_G$, as measured from an uppermost body surface 108B. In exemplary embodiments, $D_G$ is approximately less than or equal to half the maximum thickness, $T_{BMAX}$. Hence, $L_{EFF}$, is depended on $D_G$.

In some embodiments, the gate structure portion 114A extends laterally under a portion of the source structure 110 or under a portion of the drain structure 112. In the illustrative embodiment, dashed line 117 indicates a shape of the gate structure portion 114A that extends below the source structure 110 and the drain structure 112. $L_{EFF}$ may be increased when the gate structure portion 114A extends laterally under a portion of the source structure 110 and under a portion of the drain structure 112. Thus, $L_{EFF}$, can be controlled by the depth $D_G$ as well as by the shape of the gate structure portion 114A.

As shown, the gate structure has a physical gate width, $W_G$. $W_G$ may vary depending on the profile of the gate structure 114. In the illustrative embodiment, gate structure portion 114B has a substantially vertical profile and gate structure 114A tapers to form a "U" shaped structure. As shown, a maximum $W_G$ is substantially similar for both gate structure portions 114A and 114B. When the gate structure portion 114A extends laterally under a portion of the source structure 110 and under a portion of the drain structure 112, $W_G$ of the gate structure portion 114A is greater than $W_G$ of the gate structure portion 114B. Depending on embodiments, gate structure portion 114B has a width, $W_G$ that is between 15 nm and 70 nm.

In some embodiments, the shape and depth of the gate structure portion 114A and a spatial extent of doping within the source structure 110 and the drain structure 112 determine $L_{EFF}$ of the transistor 106. In an embodiment, the source structure 110 includes a first source region 110A directly adjacent to the body 108 where the first source region 110A includes no or trace amounts of dopants. In some such embodiments, the source structure 110 further includes a second source region 110B above the first source region 110A where the second source region 110B includes dopants. The dopant species may depend on an N or a P MOS transistor type desired and may include phosphorus, arsenic or boron. In some embodiments, the dopant concentration in the second source region 110B is between 2e20-1e21 atoms/cm^3.

In an embodiment, the drain structure 112 includes a first drain region 112A directly adjacent to the body 108 where the first drain region 112A includes no or trace amounts of dopants. In some such embodiments, the drain structure 112 further includes a second drain region 112B above the first drain region 112A where the second drain region 112B includes dopants. The dopant species may depend on an N or a P MOS transistor type desired and may include phosphorus, arsenic or boron. In some embodiments, the dopant concentration in the second drain region 112B is between 2e20-1e21 atoms/cm^3. The source structure 110 and drain structure 112 both include a same material, same dopant species, and substantially identical concentration levels. In embodiments, the source structure 110 and the drain structure 112 include Si, SiGe, Ge, InP, InAs, GaN, InN, GaAs, InGaAs, InSb, GaSb. In some embodiments, the body 108 includes a material that is different from the material of the source structure 110 and the drain structure 112.

As illustrated the first source region 110A and the first drain region 112A each have a thickness $T_{E1}$, as measured from an uppermost body surface 108B. In exemplary embodiments, the thickness is no more than 10 nm. $L_{EFF}$ may also be partially tuned by varying $T_{E1}$. The second source region 110A and second drain region 112 each have a thickness $T_{E2}$. In exemplary examples $T_{E2}$ ranges between 10 nm and 30 nm.

In the illustrative embodiment, the transistor 106 further includes a dielectric spacer 120 on a portion of the source structure 110 and on a portion of the drain structure 112. The presence of the dielectric spacer 120 allows for potential misalignment between a gate contact 122 and the gate structure 114. The presence of the dielectric spacer 120 prevents a potentially misaligned gate contact 122 having a lateral width, $W_{GC}$, that is substantially equal to $W_G$, from shorting to the source structure 110 or drain structure 112. In an embodiment, the dielectric spacer 120 has a thickness between 2 nm and 10 nm. The dielectric spacer 120 may include a material such as silicon nitride, silicon oxide, silicon carbide, silicon nitride doped with carbon, and silicon oxynitride.

The gate structure 114 further includes a third gate structure portion 114C directly on gate structure portion 114B. Gate structure portion 114C may or may not have a same gate width $W_G$, as the gate width of gate structure portions 114A and 114B. In the illustrative embodiment, structure portions 114A, 114B and 114C each have a substantially same width, $W_G$.

As shown the gate structure 114 includes a gate dielectric layer 124 and a gate electrode 126 directly in contact with the gate dielectric layer 124. In the illustrative embodiment, the gate dielectric layer 124 is directly adjacent to and in contact with the body 108, source structure 110 and drain structure 112 and dielectric spacer 120. The gate dielectric layer 124 may have a thickness that is substantially uniform everywhere. In an embodiment, the gate dielectric layer 124 has a thickness that is less than 2 nm. The gate dielectric layer 124 may include SiO2, HfO2, ZrO2, Al2O3, La2O3, TaSiOx, HfSiOx, HfZrO2, Ta2O5 or Ga2O5.

The gate electrode 126 may include a single layer of metals and alloys or one or more layers of metals and/or alloys for example, Ti, TiSi, Al, W, TiN, Pt, Ni, Pd, Co, TaN, TiC, TiAlC, TiAlN, TaC, WC, HfC, ZrC. In some embodiments, where the gate dielectric layer 124 includes SiO2, the gate electrode may include doped polysilicon.

In the illustrative embodiment, the device 100 further includes an isolation 130 between the transistor 106 and the metallization structure 102. The isolation 130 also extends over a dielectric 132 in the device level 101. The isolation layer may include silicon oxygen and one or more of carbon and nitrogen or silicon and oxygen. As shown the device 100 also includes a dielectric 134 above the isolation 130 and adjacent to the transistor 106. In an embodiment, the dielectric 134 includes any material that has a sufficient dielectric strength to provide electrical isolation such as, but not to, limited silicon dioxide, silicon nitride, silicon oxynitride, carbon doped nitride and carbon doped oxide.

For transistor 106 and device 104 to be electrically coupled, the source contact 116 or the drain contact 118 may extend through the isolation 130 and couple with the metallization structure 102. In the illustrative embodiment, the source contact 116 extends below the body 108 and is in contact with a portion of the uppermost surface 102A of the metallization structure 102. As shown, a portion of the source contact 116 is directly adjacent to at least one sidewall 108C of the body 108 and at least one sidewall 110C of the source structure 110. As shown, the sidewalls 108C and 110C are substantially coplanar. In other embodiments, depending on a lateral width (along Y direction) of the source contact 116 and alignment with the source structure 110, the source contact 116 may contact more than one sidewall of the body 108 and source structure 110.

Figure 1B:
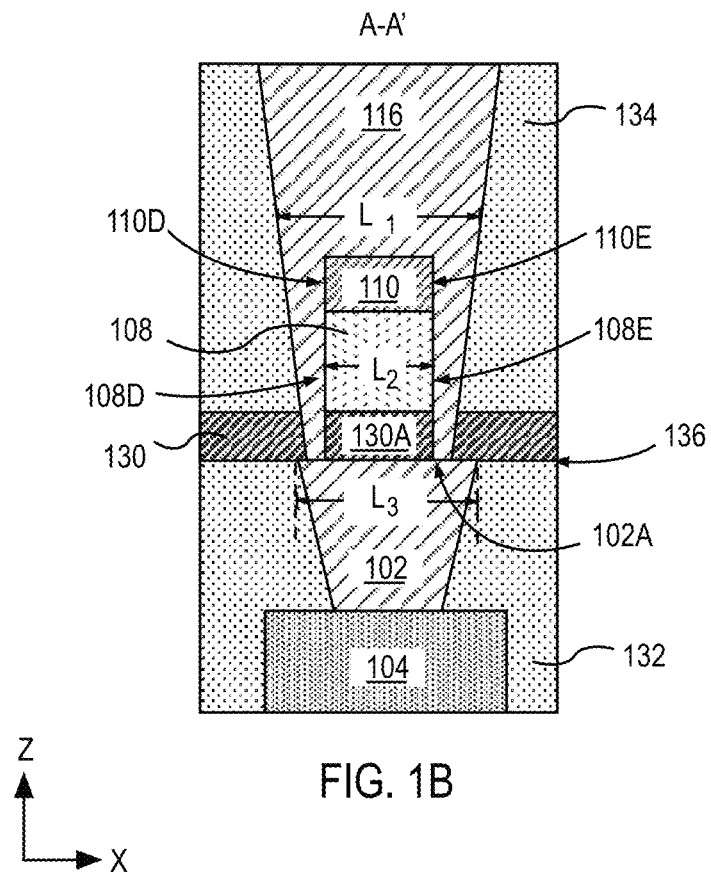
FIG. 1B illustrates a cross-sectional view across a line A-A' in FIG. 1A, in accordance with an embodiment of the present disclosure.

FIG. 1B is a cross sectional illustration taken along the line A-A' of the structure in FIG. 1A. In an embodiment, the source contract 116 has a smallest lateral width, $L_1$ at interface 136 between the source contact 116 and the metallization structure 102. each of the body 108 and source structure 110 have a lateral width, $L_2$ and the metallization structure 102 has a largest lateral width, $L_3$. In the illustrative embodiment, $L_1$ and $L_3$ are both greater than $L_2$ so that source contact 116 is in contact with the uppermost surface 102A of the metallization structure 102. In some such embodiment, source contact 116 is contact with entire portion of sidewalls 108D and 108E of the body 108. In general, $L_3$ does not need to be greater than $L_2$ or $L_1$ however, in such examples, metallization structure 102 is misaligned with the body 108 so that some portion of uppermost surface 102A is in physical contact with source contact 116.

As shown the source contact 116 is also in contact with entire portions of sidewalls 110D and 110E of the source structure 110. A source contact 116 that is in contact with entire portions of sidewalls 110D and 110E advantageously provides a reduction in electrical resistance between source contact 116 and source structure 110. In the illustrative embodiment, the sidewalls 108D and 110D are substantially coplanar and the sidewalls 108E and 110E are substantially coplanar.

In exemplary examples, where the transistor 106 is a Trigate transistor, $L_1$ and $L_2$ may be approximately 15 nm or less. For planar transistor $L_1$ and $L_2$ can be between 20 nm to 500 nm. Furthermore, as shown, a portion 130A of the isolation 130 under the body 108 is separated from a bulk isolation portion 130.

Figure 1C:
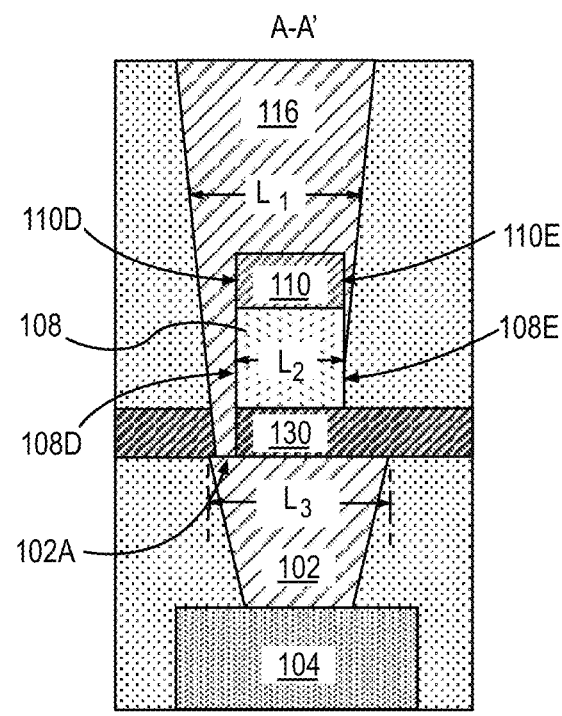
FIG. 1C illustrates a cross-sectional view across a line A-A' in FIG. 1A, in accordance with an embodiment of the present disclosure.

In other examples, the source contact 116 is misaligned with an axis (Z-axis) of the source structure 110 as illustrated in FIG. 1C. The misaligned source contact 116 may not be in contact with the entire portion of the sidewall 108C of the body 108. In some such examples, source contact 116 may be in contact with an entire portion of at least one sidewall such as sidewall 108D as shown. Depending on misalignment between the source contact 116 and the source structure 110, the source contact 116 may be in full contact with sidewalls 110D and 110E as shown, or full contact with at least one sidewall 110D or 110E (not shown). For device functionality, at least a portion of the source contact 116 is in contact with uppermost surface 102A of the metallization structure 102 in spite of misalignment between source contact 116 and the source structure 110.

The device level 101 may include least one or more metallization structures between the semiconductor device 104 and the metallization structure 102. The lateral width of the one or more metallization structures other than metallization structure 102 may be greater than or less than lateral width $L_3$.

In other embodiments, the source structure and drain structure do not have sidewalls that are substantially coplanar with sidewalls of the body of the transistor and are indicative of a processing operation utilized to fabricate the transistor.

Figure 2A:
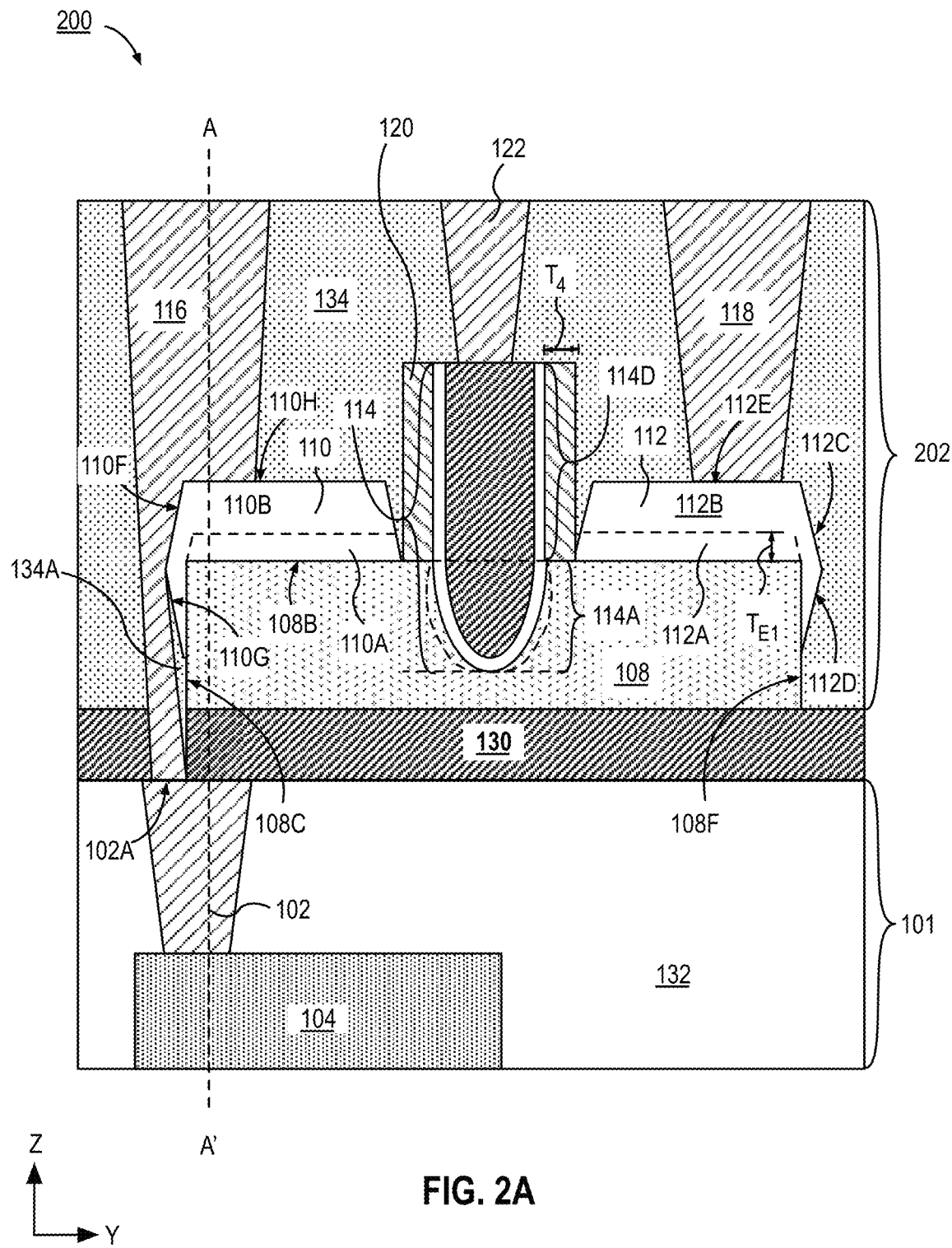
FIG. 2A illustrates a cross-sectional view of a recessed channel transistor including a raised source and raised drain epitaxial structures coupled with a device below the recessed channel transistor, in accordance with an embodiment of the present disclosure.

FIG. 2A is a cross sectional illustration of a device 200 that includes a transistor 202 having many of the features of the transistor 106. As shown, the transistor 202 includes an epitaxial source structure 110 on a first portion of the body 108 and a portion that extends on the body sidewall 108C. In the illustrative embodiment, the epitaxial source structure 110 has sidewalls such as sidewalls 110F and 110G that are not coplanar with body sidewall 108C. Similarly, the transistor 202 includes an epitaxial drain structure 112 on a second portion of the body 108 and a portion that extends on the body sidewall 108F. The epitaxial drain structure 112 includes sidewalls 112C and 112D that are not coplanar with body sidewall 108F.

In other embodiments, the source structure 110 and drain structure 112 do not extend beyond sidewalls 108C or 108F, respectively. In some such embodiments, the source structure 110 and drain structure 112 do not have sidewalls 110G and 112D, respectively.

In the illustrative embodiment, the dielectric spacer 120 is directly on a portion of the body 108 between the source structure 110 and a gate structure portion 114D. As shown, the dielectric spacer 120 is also directly on a portion of the body 108 between the drain structure 112 and the gate structure portion 114D. In the illustrative embodiment, the lateral width, $T_4$ of the dielectric spacer 120 introduces additional electrical resistance between the source structure 110 and gate structure 114 and between the drain structure 112 and the gate structure 114. The dielectric spacer 120 can be as thin as 2 nm in most embodiments. Such a dielectric structure can be advantageous to minimize charge leakage between source and drain during transistor off-state.

In some embodiments, the source structure 110 has an undoped region 110A and a doped region 110B on the undoped region 110A, and the drain structure 112 has an undoped region 112A and a doped region 112B on the undoped region 112A, as shown in the Figure. The undoped region may have a profile that resembles the sidewall 110F and top surface 110H. In an embodiment, the undoped region 112A has a profile that resembles the sidewalls 112C and top surface 112E. The undoped regions 110A and 112A may have substantially similar thicknesses, $T_{E1}$, as measured from the body surface 108B. In exemplary embodiments, $T_{E1}$, is between 1 nm and 20 nm. The undoped regions 110A and 112A in the epitaxial source structure 110 and epitaxial drain structure 112, respectively, may include one or more materials that are substantially the same as the materials discussed above. In embodiments, the doped regions 110B and 112B in the epitaxial source structure 110 and epitaxial drain structure 112, respectively, may include one or more materials, dopants and dopant concentration that are substantially the same as the materials, dopants and dopant concentration discussed above.

In the illustrative embodiment, where the epitaxial source structure 116 includes a portion on the body sidewall 108C, a dielectric portion 134A is also present adjacent to sidewalls 108C and 110G. In some such embodiments, the source contact 116 is not adjacent to the body 108.

Figure 2B:
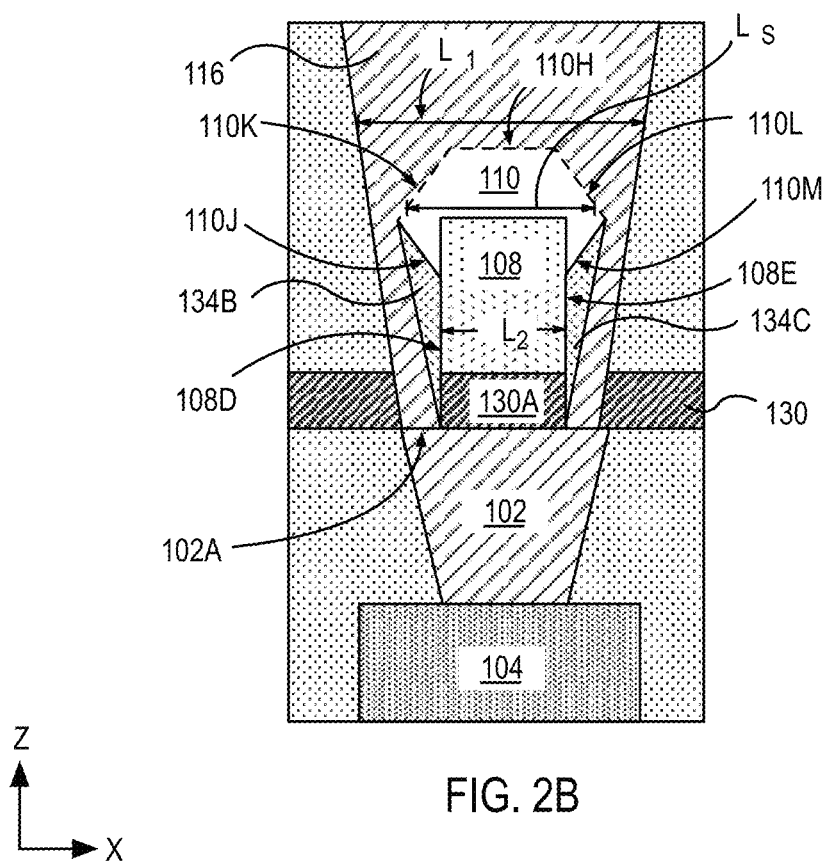
FIG. 2B illustrates a cross-sectional view across a line A-A' in FIG. 2A, in accordance with an embodiment of the present disclosure.

FIG. 2B illustrates a cross-sectional view of the source contact 116 and source structure 110 taken across a line A-A' in FIG. 2A. As shown, the source contact 116 extends through the isolation 130 to an uppermost surface 102A of the metallization structure 102.

When the source contact 116 has a width, $L_1$, that is greater than a maximum lateral width, $L_S$ of the source structure 110 or greater than a lateral width, $L_2$ of body 108, the source contact 116 may be in contact with some surfaces of the source structure 110 while not in contact with others. In some examples, when the source structure 110 has faceted sidewalls, the source contact 116 may be in contact with some of the faceted sidewalls of the source structure 110 while not in contact with others. For example, as shown the source structure 116 may have faceted sidewalls 110J, 110K, 110L and 110M. In the illustrative embodiment, the source structure 116 is in direct contact with sidewalls 110K and 110L, but not in contact with the sidewalls 110J and 110M.

For example, when the source structure 110 extends beyond sidewalls 108D and 108E as shown, portions of dielectric 134 may be adjacent to body 108. In the illustrative embodiment, dielectric portions 134B and 134C are adjacent to sidewalls 108D and 110J, and sidewalls 108E and 110M, respectively. The dielectric portions 134B and 134C may prevent direct contact between the source structure 116 and the sidewalls 110J and 110M, respectively and direct contact between the source structure 116 and sidewalls 108D and 108E, respectively.

Figure 2C:
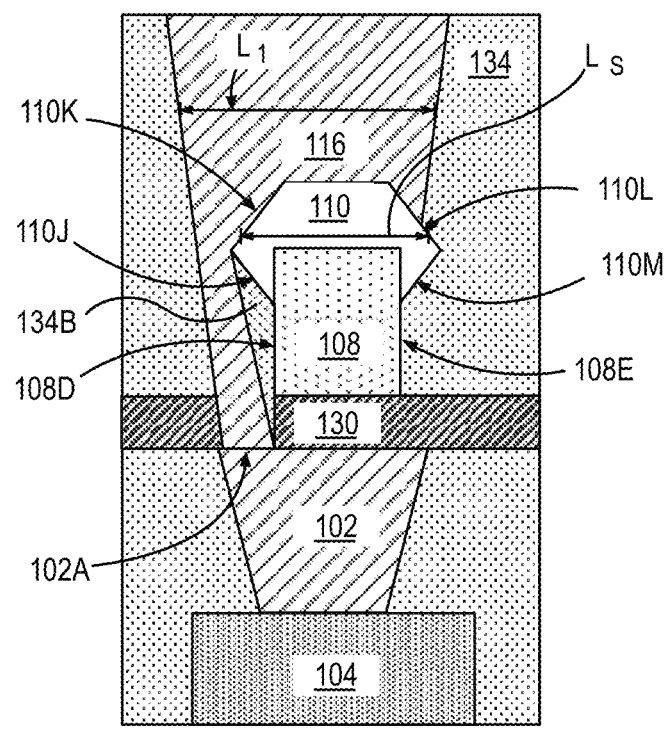
FIG. 2C illustrates a cross-sectional view across a line A-A', in FIG. 2A, in accordance with an embodiment of the present disclosure.

In other examples, $L_1$ is greater that $L_2$ and/or $L_S$, the source contact 116 may be misaligned with respect to an axis of the body 108. In such an example, the source contact 116 may be present on only one side of the body 108 but still be in contact with the uppermost surface 102A, as shown in FIG. 2C. In a further such example, depending on $L_1$, the source contact 116 may be adjacent to a portion of sidewall 110L of the source structure 110 and dielectric 134 may be present adjacent to the remaining portion of sidewall 110L. However, as shown, where the source structure 110 has faceted sidewalls 110L and 110M, the dielectric 134 is adjacent to the sidewall 108E.

Figure 3:
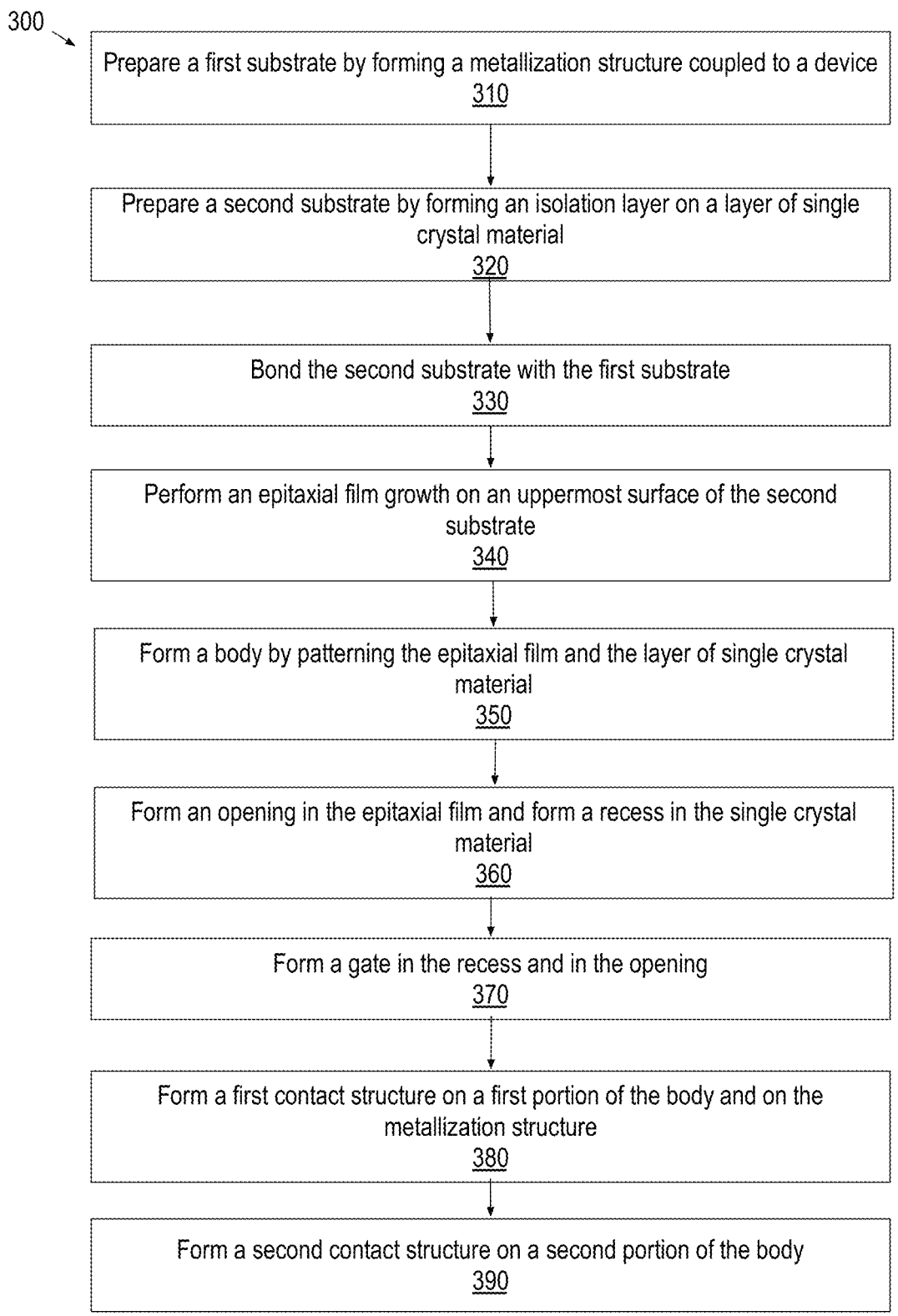
FIG. 3 illustrates a flow diagram for a method to fabricate a recessed channel transistor, in accordance with an embodiment of the present disclosure.

FIG. 3 illustrates a flow diagram for a method to fabricate a recessed channel transistor, in accordance with an embodiment of the present disclosure. The method 300 begins at operation 310 by preparing a first substrate by forming a metallization structure coupled to a semiconductor device. The method 300 continues at operation 320 by preparing a second substrate by forming an isolation layer on a layer of single crystal material. The method 300 continues at operation 330 with a process to bond the first substrate with the second substrate. The method 300 continues at operation 340 with a process to grow an epitaxial film on the layer of single crystal material. The method 300 continues at operation 350 with a process to form a body by patterning the epitaxial film and the layer single crystal material to form a body. The method 300 continues at operation 360 with etching an opening in the epitaxial film and recessing a portion of the underlying single crystal material. The method 300 continues at operation 370 with the formation of a gate structure in the recess and in the opening. The method 300 continues at operation 380 with the formation of a first contact structure on a portion of the body and on the metallization structure. The method concludes at operation 390 with the formation of second contact structure on a second portion of the body where the second portion and the first portion are separated by a gate.

Figure 4A:
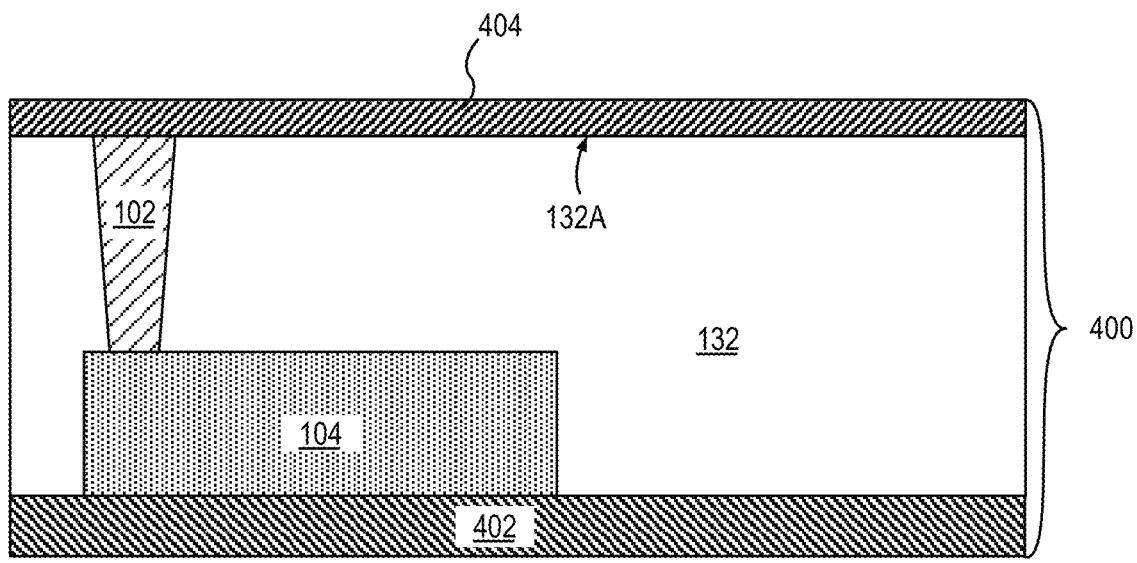
FIG. 4A illustrates a first wafer including a device and an interconnect metallization structure coupled with the device and a first isolation layer on the interconnect metallization structure.

FIG. 4A illustrates a wafer 400 including a device 104 formed above a substrate 402 and an interconnect metallization structure 102 coupled with the device 104. In the illustrative embodiment, the device 104 and the interconnect structure 102 is embedded in a dielectric 132. An isolation layer 404 is deposited on the interconnect metallization structure 102 and on an uppermost surface 132A of the dielectric 132. The isolation layer 404 may be blanket deposited on the metallization structure 102 and on the dielectric 132 by a plasma enhanced chemical vapor deposition (PECVD) or a chemical vapor deposition (CVD) process. The isolation layer 404 may include silicon, oxygen and/or nitrogen. In an embodiment, the deposition process involves doping the dielectric with carbon. The percent of carbon in the isolation layer 404 can be controlled during the deposition process and ranges between 2 and 30 atomic percent of the isolation layer 404. The isolation layer 404 may be deposited to a thickness between 10 nm and 50 nm.

Figure 4B:
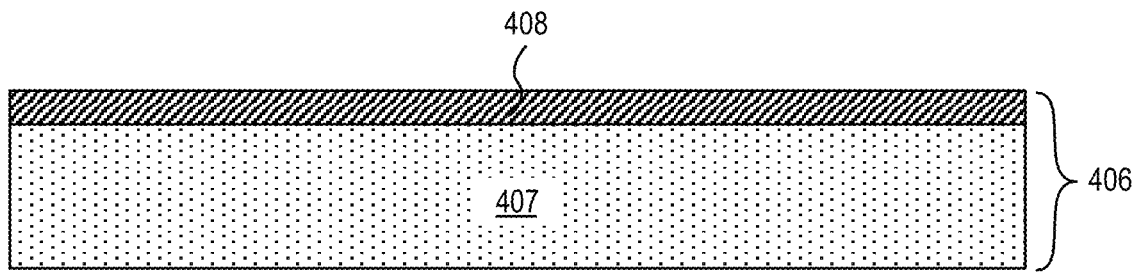
FIG. 4B illustrate a second wafer including a layer of single crystal material and a second isolation layer on the layer of single crystal material.

FIG. 4B illustrates a wafer 406 including a layer of single crystal semiconductor material 407 and an isolation layer 408 formed on the semiconductor material 407. In an embodiment, the isolation layer 408 includes a material that is substantially the same as the material of the isolation layer 404.

Figure 4C:
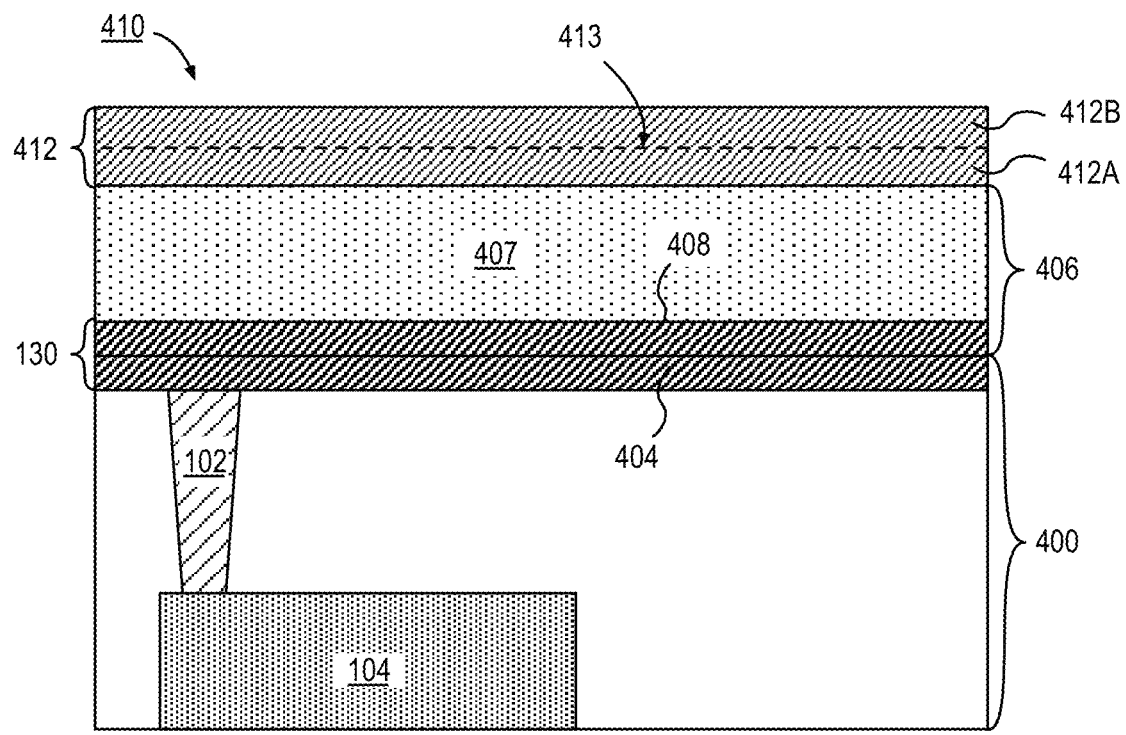
FIG. 4C illustrates a structure after a process is performed to bond the first wafer with the second wafer and growth of a doped semiconductor material on the layer of single crystal material.

FIG. 4C illustrates a resulting wafer 410 after a process is performed to bond the wafer 406 with the wafer 400. In an embodiment, a chemical treatment of the isolation layer 404 and isolation layer 408 is performed before the bonding process. In embodiments where the isolation layer 404 and isolation layer 408 includes carbon the chemical treatment process (or an activation process) includes process methods to reduce the carbon content of uppermost surface portions of each of the isolation layers 404 and 408. The bonding process requires a coarse alignment between a non-patterned wafer 406 and a patterned wafer such as wafer 400. Bonding between a non-patterned and a patterned wafer is highly desirable because it avoids a need for a careful alignment process between patterned structures. In some embodiments, an interface between the isolation layer 404 and isolation layer 408 are not clearly visible after the bonding process. The resulting structure is herein referred to as an isolation 130. After the bonding process, a semiconductor material 412 is grown by an epitaxial process that templates off the single crystal semiconductor material 407.

In an embodiment, the epitaxial process can be utilized to grow a first portion 412A that is undoped and a second portion 412B above the first portion 412A that is doped. In an embodiment, the first portion 412A and second portion 412B include Si and Ge. In an embodiment, the dopant species depends on a MOS characteristic desired. The dopant density can be fixed in the second portion 412B or gradually increased away from an interface 413 between the first portion 412A and second portion 412B. In an embodiment, the dopant species is introduced during the deposition process. In an embodiment, a temperature of the epitaxial deposition process is between 350-550 degrees Celsius. It is to be appreciated that process temperatures in the range of 350-550 degrees Celsius does not affect MOS characteristics of the device 104. In embodiments, where a higher growth temperature is desired, the semiconductor material 412 may be grown before the bonding process.

Figure 4D:
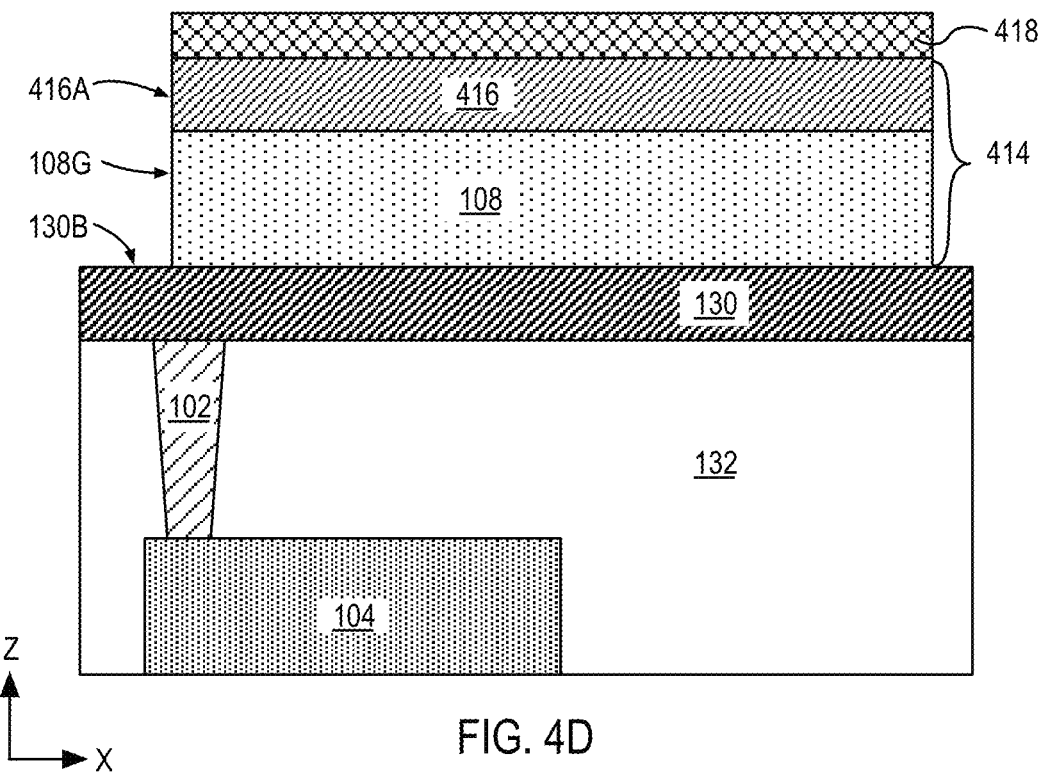
FIG. 4D illustrates the structure of FIG. 4C following the patterning of the layer of doped semiconductor material and the layer of single crystal material.

FIG. 4D illustrates the structure of FIG. 4C following the patterning of the layer of semiconductor material 407 and the layer of semiconductor material 412 to form a patterned block 414. The patterned block 414 includes a body 108 and an epitaxial block 416. In an embodiment, the block 414 has a vertical sidewall profile where sidewalls such as for example, sidewalls 416A and 108G are substantially coplanar. The patterned block may be formed by forming a mask 418 on the layer of semiconductor material 412 by a lithographic process and then etching.

In an embodiment, the plasma etch process is sufficiently anisotropic and forms sidewalls 416A and 108G that are substantially vertical with respect to an uppermost surface 130B of the isolation 130.

Figure 4E:
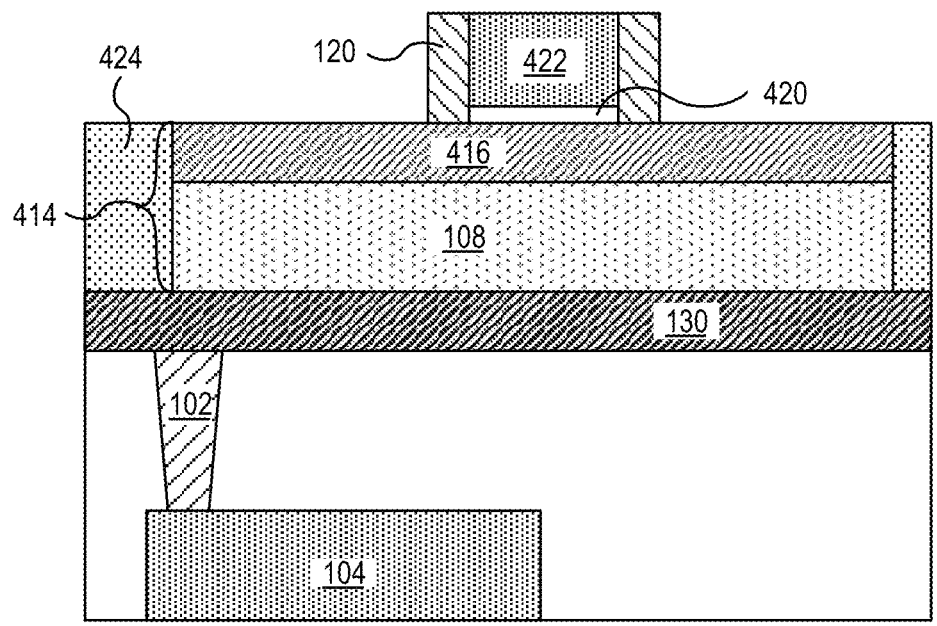
FIG. 4E illustrates the structure of FIG. 4D following the formation of a dummy gate dielectric layer on the doped semiconductor material, formation of a dummy gate on the dummy gate dielectric layer and the formation of dielectric spacer adjacent to the dummy gate dielectric layer and the dummy gate.

FIG. 4E illustrates the structure of FIG. 4D following the formation of a dummy gate dielectric layer 420 on the block 414, formation of a dummy gate 422 on the dummy gate dielectric layer 420 and the formation of dielectric spacer 120 adjacent to the dummy gate dielectric layer 420 and the dummy gate 422. Depending on the architecture required, the dummy gate 422 may be a planar dummy gate or a dummy gate with a tri-gate structure. The dummy gate 422 has a lateral width, $W_{DG}$, that may be chosen close to the desired width of the gate structure to be fabricated in a downstream process.

In the illustrative embodiment, a dielectric 424 is blanket deposited on the structure of FIG. 4D (after removing the mask 418). The dielectric 424 includes silicon and oxygen or silicon, oxygen and carbon. A planarization process is utilized to remove the excess dielectric 424 deposited on the epitaxial block 416 before the dummy gate is fabricated.

In an embodiment, a dummy gate dielectric layer 420 is deposited on the epitaxial block 416 and on the dielectric 424. Subsequently a layer of dummy gate material is deposited on the dummy gate dielectric layer 420. In an embodiment, the dummy gate dielectric layer 420 includes a layer of material such as but not limited to silicon dioxide or silicon carbide and the dummy gate material includes a layer of material such as a doped polysilicon. In an embodiment, a resist mask is formed on the layer of dummy gate material. In an embodiment, the layer of dummy gate material is then subsequently patterned by a plasma etch process and the dummy gate dielectric layer is patterned using a wet etch removal to form dummy gate dielectric layer 420 and dummy gate 422 on the dummy gate dielectric layer 420. A dielectric spacer layer is then deposited on the dummy gate 422 and on the epitaxial block 416 and on the dielectric 424. In an embodiment, the dielectric spacer layer is then patterned using a plasma etch process to form dielectric spacer 120.

In embodiments, where a non-planar transistor is desired, the dielectric 424 is formed after formation of the dummy gate structure.

Figure 4F:
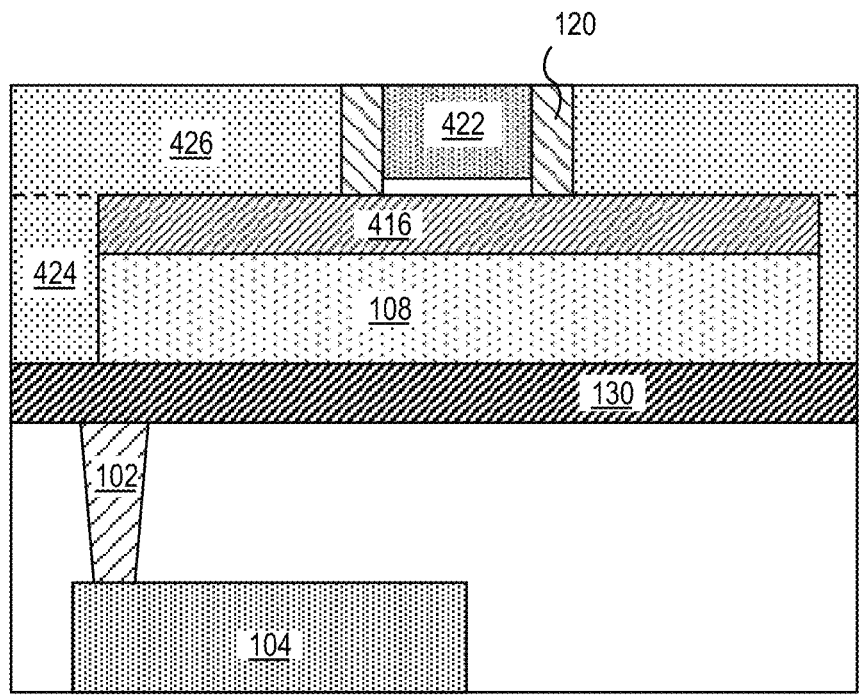
FIG. 4F illustrates a cross-sectional view of the structure of FIG. 4E following the formation of a first dielectric on the dummy gate, on the dielectric spacer and on portions of the doped semiconductor material and following planarization of uppermost portions of the dummy gate, first dielectric and dielectric spacer.

FIG. 4F illustrates a cross-sectional view of the structure of FIG. 4E following the formation of a dielectric 426. In an embodiment, dielectric 426 is blanket deposited on the epitaxial block 416, on the dielectric 424, on the dummy gate 422, and on the dielectric spacer 120. The dielectric 426 is then planarized.

Figure 4G:
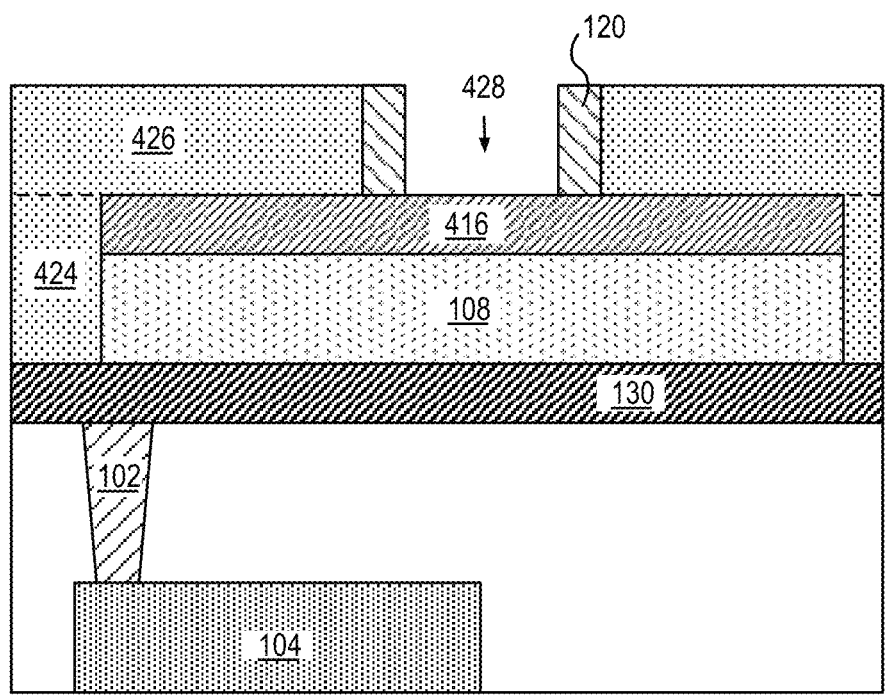
FIG. 4G illustrates the structure of FIG. 4F following the removal of the dummy gate and the dummy gate dielectric and expose a portion of the doped semiconductor material.

FIG. 4G illustrates the structure of FIG. 4F following the removal of the dummy gate 422 and the dummy gate dielectric 420 and expose a portion of the epitaxial block 416. In an embodiment, dummy gate 422 is removed by an etch process that was utilized to pattern and form the dummy gate and the dummy gate dielectric layer 420 is removed by a wet process utilized in patterning the dummy gate dielectric layer, as discussed above. As shown, removal of the dummy gate 422 and the dummy gate dielectric layer 420 creates an opening 428.

Figure 4H:
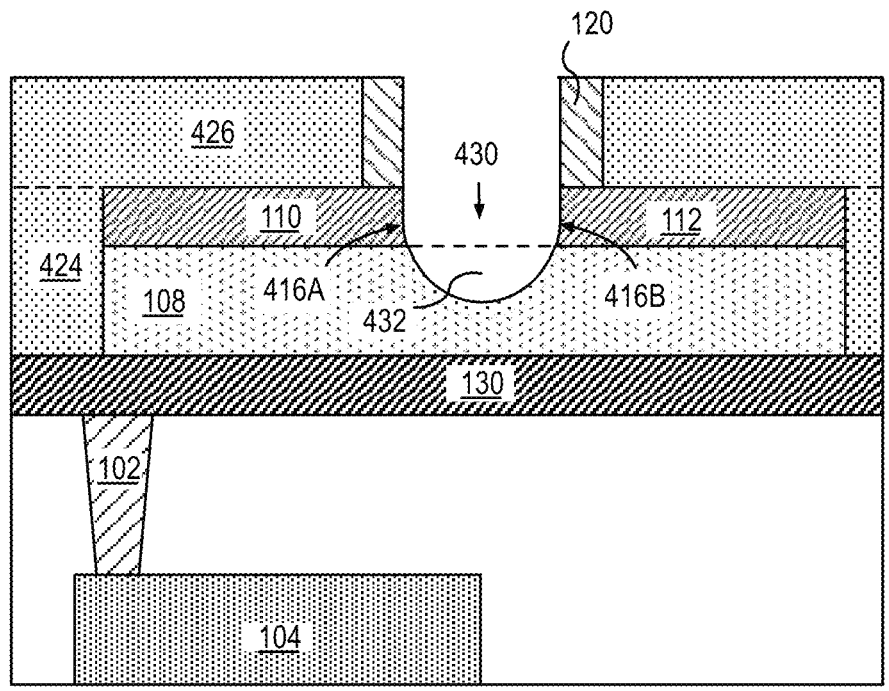
FIG. 4H illustrates the structure of FIG. 4G following a process to etch the exposed portion of the doped semiconductor material and recess a portion of the single crystal material exposed after etching the doped semiconductor material.

FIG. 4H illustrates the structure of FIG. 4G following a process to etch the exposed portion of the epitaxial block 416 to form an opening 430 and etch to form a recess 432 in body 108. In an embodiment, a plasma etch with a high anisotropic etchant is utilized to pattern the opening 430 in the epitaxial block 416. The opening 430 isolates and forms source structure 110 and drain structure 112. The sidewalls 416A and 416B formed in the epitaxial block 416 may be substantially vertical. In the illustrative embodiment, the sidewalls 416A and 416B are mostly vertical with a portion near the body 108 that has a curved surface portion. The plasma etch may be tuned to obtain a variety of different profiles of the sidewalls 416A and 416B. In another embodiment, the 416A and 416B are substantially vertical with no curved portions. In yet another embodiment, the sidewalls 416A and 416B are uniformly curved along the entire sidewall portions. In some embodiments, profiles of sidewalls 416A and 416B may be dependent on the dopant concentration and profile, for example, some portions may appear rougher than others.

The plasma etch process is continued after etching the epitaxial block 416 to form the recess 432. In the illustrative embodiment, the recess 432 is hemispherical. In other embodiments, a wet etch process is utilized to form a recess that is "V" shaped. In other embodiments, a plasma etch process is utilized to form a groove in the body 108. In some embodiments, a combination of wet etch and plasma etch process is utilized to extend the recess laterally under the source structure 110 and drain structure 112.

Figure 4I:
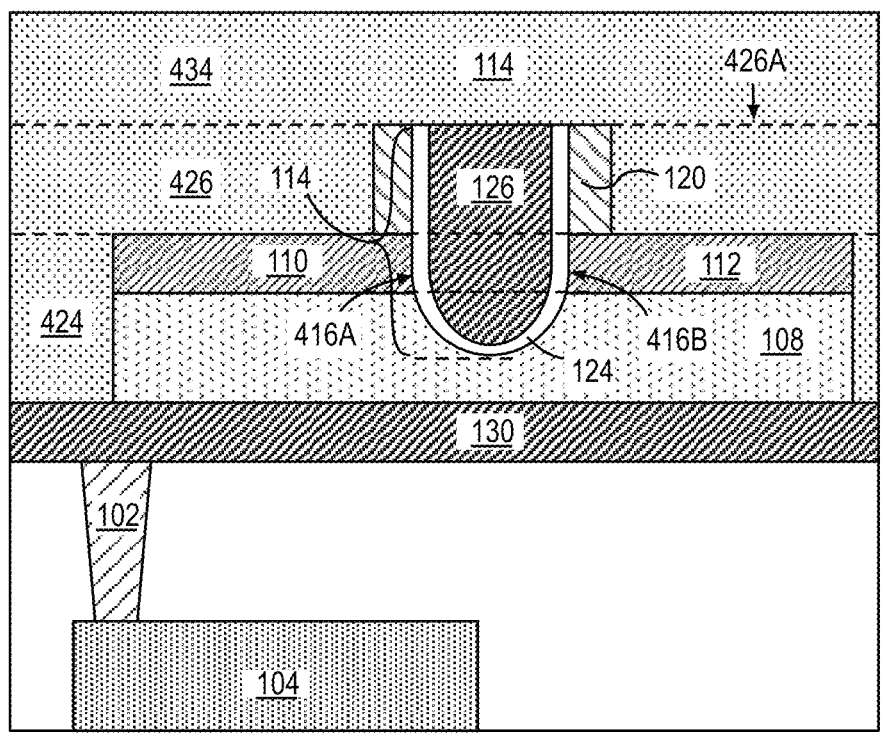
FIG. 4I illustrates the structure of FIG. 4H following a deposition of a gate dielectric layer and a gate material, following a process to planarize and remove excess portions of the gate dielectric layer and a gate material from above the first dielectric, uppermost surface of dielectric spacer and following the formation of a second dielectric on planarized upper surfaces of the gate dielectric, gate material, dielectric spacer and the first dielectric.

FIG. 4I illustrates the structure of FIG. 4H following the formation of a gate structure 114 and a dielectric 434 above the gate structure 114. In an embodiment, structure is formed by depositing a gate dielectric layer 124 on the body 108, on sidewalls 416A and 416B and adjacent to the dielectric spacer 120 and on an uppermost surface 426A. A gate electrode material is then deposited on the surface of the gate dielectric layer 124. A planarization process is utilized to remove the excess gate dielectric layer 124 from above the dielectric 426 and the dielectric spacer 120, and the gate electrode material from above the gate dielectric layer 124. The planarization process forms a gate structure 114 having a gate electrode 126 and a gate dielectric layer 124.

A dielectric 434 is then blanket deposited, using a PECVD, CVD or a PVD method described above, on planarized upper surfaces of the gate dielectric layer 124, gate electrode material 126, dielectric spacer 120 and the dielectric 426.

Figure 4J:
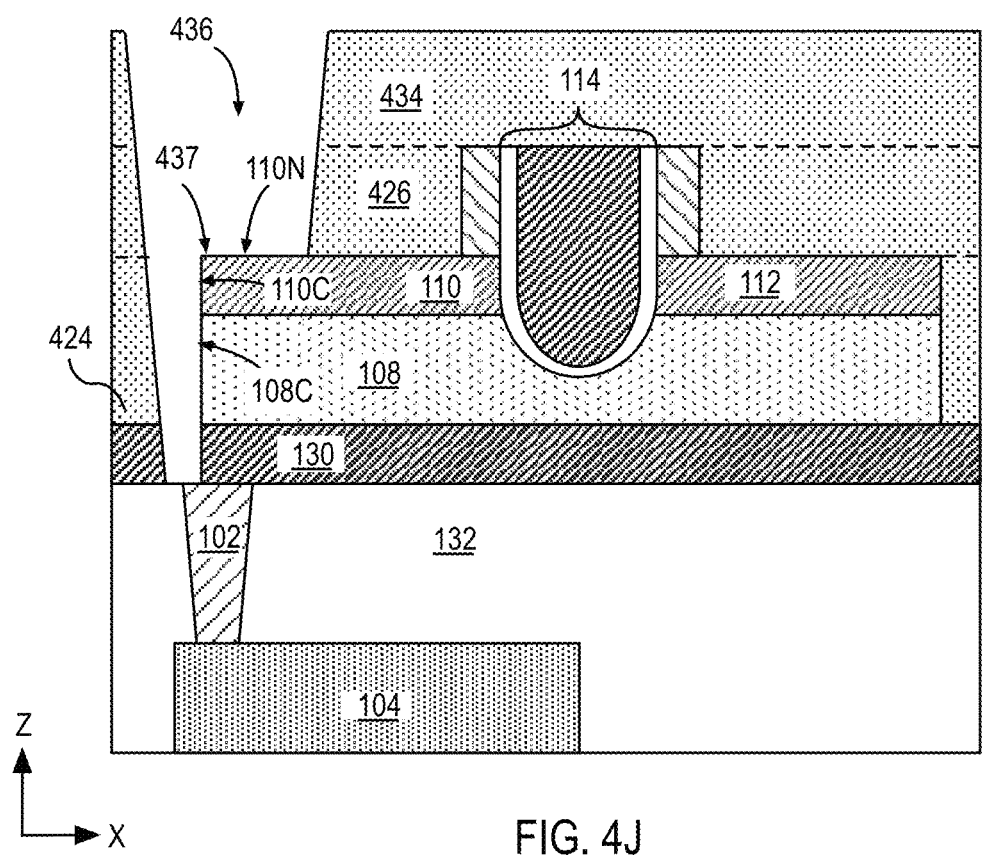
FIG. 4J illustrates the structure of FIG. 4I following a process to form a contact opening in the second dielectric, in the first dielectric, in the second isolation layer and in the first isolation layer to expose the doped semiconductor material and the metallization interconnect below the first isolation layer.

FIG. 4J illustrates the structure of FIG. 4I following a process to form a contact opening 436 in the dielectric 434, the dielectric 426, dielectric 424, and in the isolation 130. In an embodiment, a plasma etch process is utilized to form the contact opening 436 where the plasma etch removes the dielectric 434 and 426 from above the source structure 110, the dielectric 424 from sidewall 110C and sidewall 108C. The plasma etch process is then continued to etch the isolation 130 and expose the metallization structure 102 below the isolation 130. Depending on a lateral width (Y-direction) of the opening 436, a portion of the dielectric 132 may also be exposed. In some embodiments, a corner portion 437 of the source structure 110 may be rounded by the plasma etch process. In other embodiments, upper most surface 110N may be etched by as much as 1 nm-2 nm after the contact opening process.

Figure 4K:
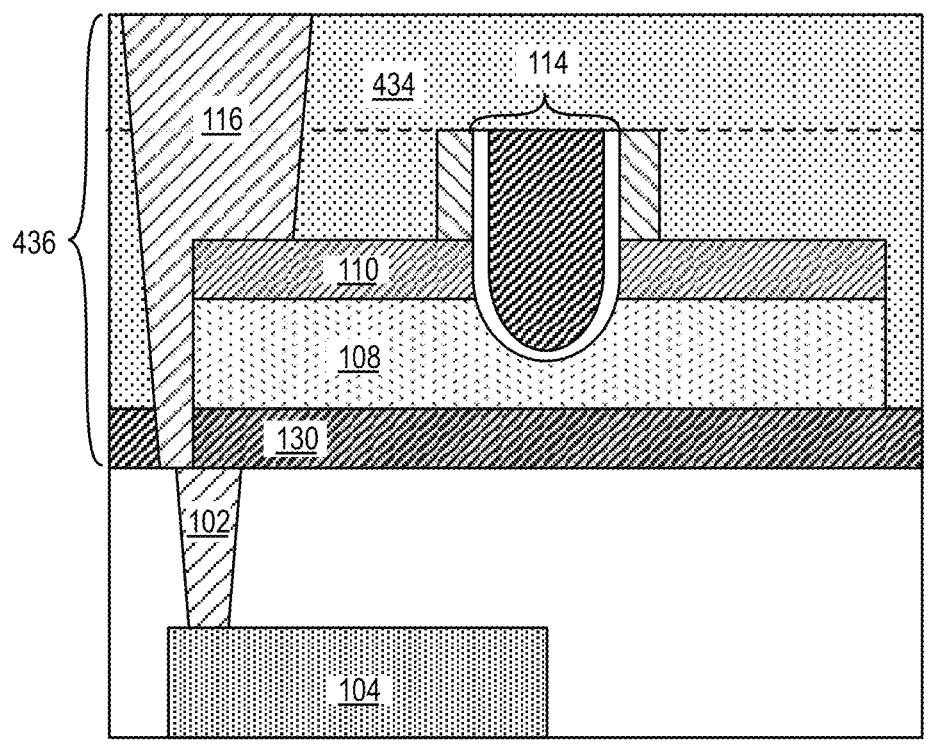
FIG. 4K illustrates the structure of FIG. 4J following a deposition of a source contact material in the contact opening.

FIG. 4K illustrates the structure of FIG. 4J following a deposition of a source contact material in the contact opening followed by planarization of the source contact material to form a source contact 116. In an embodiment, the source contact 116 includes a liner layer and conductive cap. In an embodiment, the liner layer incudes Ti, Ru or Al and a conductive cap on the liner layer. The conductive cap may include a material such as W, Co, Ni or Cu.

Figure 4L:
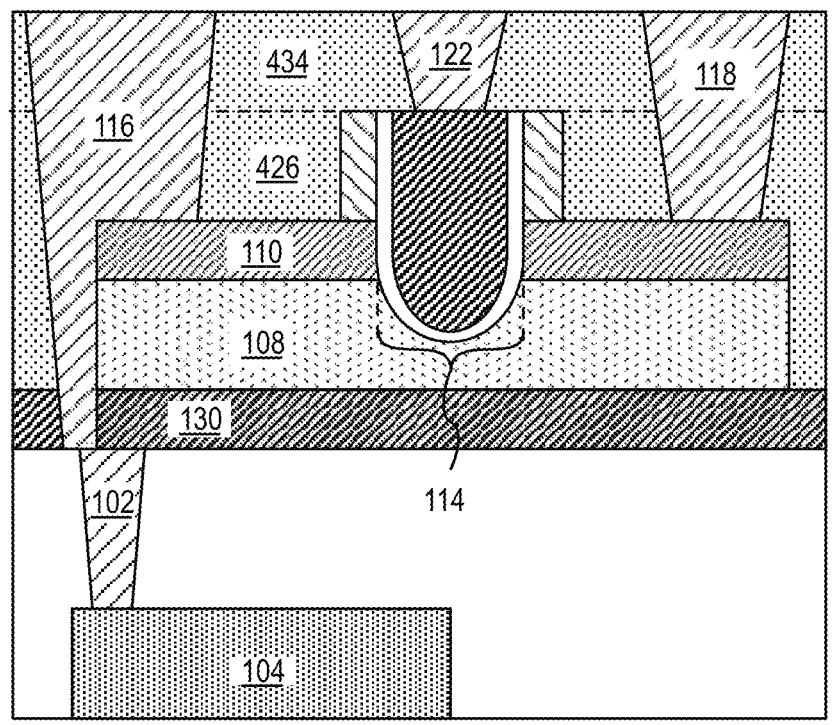
FIG. 4L illustrates the structure of FIG. 4K following the formation of a drain contact and following the formation of a gate contact.

FIG. 4L illustrates the structure of FIG. 4K following the formation of a drain contact 118 and the formation of a gate contact 122. In an embodiment, the process utilized to form the source contact 116 is repeated twice to form openings in various dielectric layers to form the drain contact 118 and gate contact 122. In an embodiment, a drain opening is formed in the dielectric 434 and dielectric 426 to form the drain contact 118. In an embodiment, a drain contact material that is the same or substantially the same as the material utilized for source contact 116 is deposited into the drain opening. In one embodiment, a planarization process is then carried out to remove the one or more layers of contact metal from the uppermost surface of the dielectric layer 434 and from uppermost surfaces of the source contact 116 to form a drain contact 118.

In an embodiment, a gate opening is formed in the dielectric 434 to form the gate contact 122. In an embodiment, a gate contact material that is the same or substantially the same as the material utilized for source contact 116 is deposited into the drain opening. In one embodiment, a planarization process is then carried out to remove the one or more layers of contact metal from the uppermost surface of the dielectric layer 434 and from uppermost surfaces of the source contact 116 and drain contact 118 to form the gate contact 122.

In another embodiment, gate contact 122 may be fabricated prior to forming drain contact 118.

Figure 5:
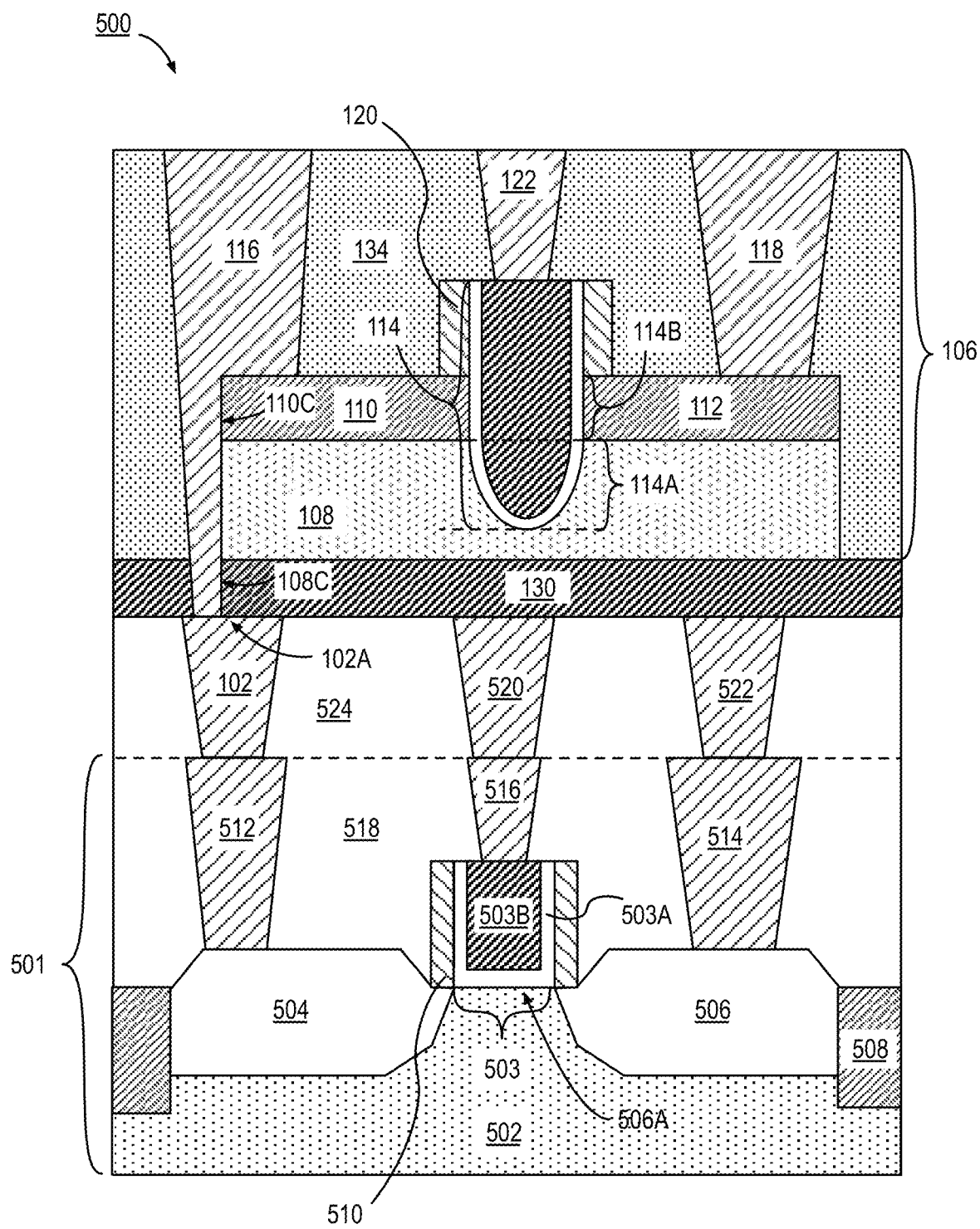
FIG. 5 illustrates a cross-sectional view of a device including a transistor with a recessed channel coupled to a metallization structure that is coupled with a drain contact of a MOS transistor.

FIG. 5 illustrates a cross-sectional view of a system 500 including a transistor 106 with a recessed body 108, where the transistor 106 is coupled to an MOS transistor 501 through a metallization structure 102, in accordance with an embodiment of the present disclosure.

The transistor 106 has one or more features of transistor 106 described in association with FIG. 1A, for example, transistor 106 has a body 108 including a single crystal group III-V or group IV semiconductor material, a source structure 110 on a first portion of the body 108 and a drain structure 112 on a second portion of the body 108, where the source structure 110 is separate from the drain structure 112. The transistor 106 further includes a gate structure 114 including a first gate structure portion 114A in a recess in the body 108 and a second gate structure portion 114B between the source structure 110 and the drain structure 112. A source contact 116 is coupled with the source structure 110 and a drain contact 118 is coupled with the drain structure 112. As shown, the source contact 116 is in contact with the metallization structure 102. In other embodiments, the drain contact 118 is in contact with the metallization structure 102. For transistor 106 and device 104 to be electrically coupled, the source contact 116 or the drain contact 118 may extend through the isolation 130 and couple with the metallization structure 102. In the illustrative embodiment, the source contact 116 extends below the body 108 and is in contact with a portion of the uppermost surface 102A of the metallization structure 102. As shown, a portion of the source contact 116 is directly adjacent to least one sidewall 108C of the body 108 and at least one sidewall 110C of the source structure 110. As shown, the sidewalls 108C and 110C are substantially coplanar.

In an embodiment, the transistor 501 is on a substrate 502 and has a gate 503, a source region 504, and a drain region 506. In the illustrative embodiment, an isolation 508 is adjacent to the source region 504, drain region 506 and portions of the substrate 502. In some implementations of the disclosure, such as is shown, a pair of sidewall spacers 510 are on opposing sides of the gate 503. The transistor 501 further includes a source contact 512 above and electrically coupled to the source region 504, a drain contact 514 above and electrically coupled to the drain region 506, a gate contact 516 above and electrically coupled to the gate 503, as is illustrated in FIG. 5. The transistor 501 also includes dielectric 518 adjacent to the gate 503, source region 504, drain region 506, isolation 508, sidewall spacers 510, gate contact 516, contact 514 and contact 516. In the illustrative embodiment, the metallization structure 102 is directly on and in contact with the source contact 512. In other embodiments, there are one or more additional levels including one or more interconnect structures between source contact 512 and metallization structure 102.

Gate contact 516 and contact 514 are each coupled with one or more interconnect structures. In the illustrative embodiment, gate contact 516 is coupled with a gate interconnect 520 and the drain contact 514 is coupled with an interconnect 522. A dielectric 524 is adjacent to interconnect metallization structure 102, interconnect 520 and interconnect 522 and dielectric 518.

In an embodiment, the underlying substrate 502 represents a surface used to manufacture integrated circuits. Suitable substrate 502 includes a material such as single crystal silicon, polycrystalline silicon and silicon on insulator (SOI), as well as substrates formed of other semiconductor materials. In some embodiments, the substrate 502 is the same as or substantially the same as the substrate 108. The substrate 502 may also include semiconductor materials, metals, dielectrics, dopants, and other materials commonly found in semiconductor substrates.

In an embodiment, the transistor 501 associated with substrate 502 are metal-oxide-semiconductor field-effect transistors (MOSFET or simply MOS transistors), fabricated on the substrate 502. In some embodiments, the transistor 501 is an access transistor 501. In various implementations of the disclosure, the transistor 501 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 503 includes at least two layers, a gate dielectric layer 503A and a gate electrode 503B. The gate dielectric layer 503A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 503A to improve its quality when a high-k material is used.

The gate electrode 503B of the access transistor 501 of substrate 502 is formed on the gate dielectric layer 503A and may consist of at least one P-type work function metal or N-type work function metal, depending on whether the transistor is to be a PMOS or an NMOS transistor. In some implementations, the gate electrode 503B may consist of a stack of two or more metal layers, where one or more metal layers are work function metal layers and at least one metal layer is a conductive fill layer.

For a PMOS transistor, metals that may be used for the gate electrode 503B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate dielectric 503A may consist of a "U"-shaped structure that includes a bottom portion substantially parallel to the surface of the substrate 502 and two sidewall portions that are substantially perpendicular to a top surface 506A of the substrate 502. In another implementation, at least one of the metal layers that form the gate electrode 503B may simply be a planar layer that is substantially parallel to the top surface 506A of the substrate 50A6 and does not include sidewall portions substantially perpendicular to the top surface 506A. In further implementations of the disclosure, the gate 503 may consist of a combination of U-shaped structures and planar, non-U-shaped structures. For example, the gate 503 may include one or more U-shaped metal layers formed atop one or more planar, non-U-shaped layers.

The sidewall spacers 510 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 504 and drain region 506 are formed within the substrate adjacent to the gate stack of each MOS transistor. The source region 504 and drain region 506 are generally formed using either an implantation/diffusion process or an etching/deposition process. In the former process, dopants such as boron, aluminum, antimony, phosphorous, or arsenic may be ion-implanted into the substrate to form the source region 504 and drain region 506. An annealing process that activates the dopants and causes them to diffuse further into the substrate typically follows the ion implantation process. In the latter process, the substrate 502 may first be etched to form recesses at the locations of the source and drain regions. An epitaxial deposition process may then be carried out to fill the recesses with material that is used to fabricate the source region 504 and drain region 506. In some implementations, the source region 504 and drain region 506 may be fabricated using a silicon alloy such as silicon germanium or silicon carbide. In some implementations, an epitaxially deposited silicon alloy may be doped in situ with dopants such as boron, arsenic, or phosphorous. In further embodiments, the source region 504 and drain region 506 may be formed using one or more alternate semiconductor materials such as germanium or a group III-V material or alloy. And in further embodiments, one or more layers of metal and/or metal alloys may be used to form the source region 504 and drain region 506.

In an embodiment, the source contact 512, the drain contact 514 and gate contact 516 each include a liner layer and fill metal. In an embodiment, the liner layer incudes Ti, Ru or Al and a conductive cap on the liner layer. The conductive cap may include a material such as W, Ni, Co or Cu.

In an embodiment, gate interconnect 520, drain interconnect 522 each include a material that is the same or substantially the same as the material of the metallization structure 102. In one such embodiment, the fill metal includes copper. In an embodiment, gate interconnect 520, drain interconnect 522 each include a material that is the same or substantially the same as the material of the gate contact 516 and drain contact 514.

The isolation 508 and dielectric 518 and 524 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 6:
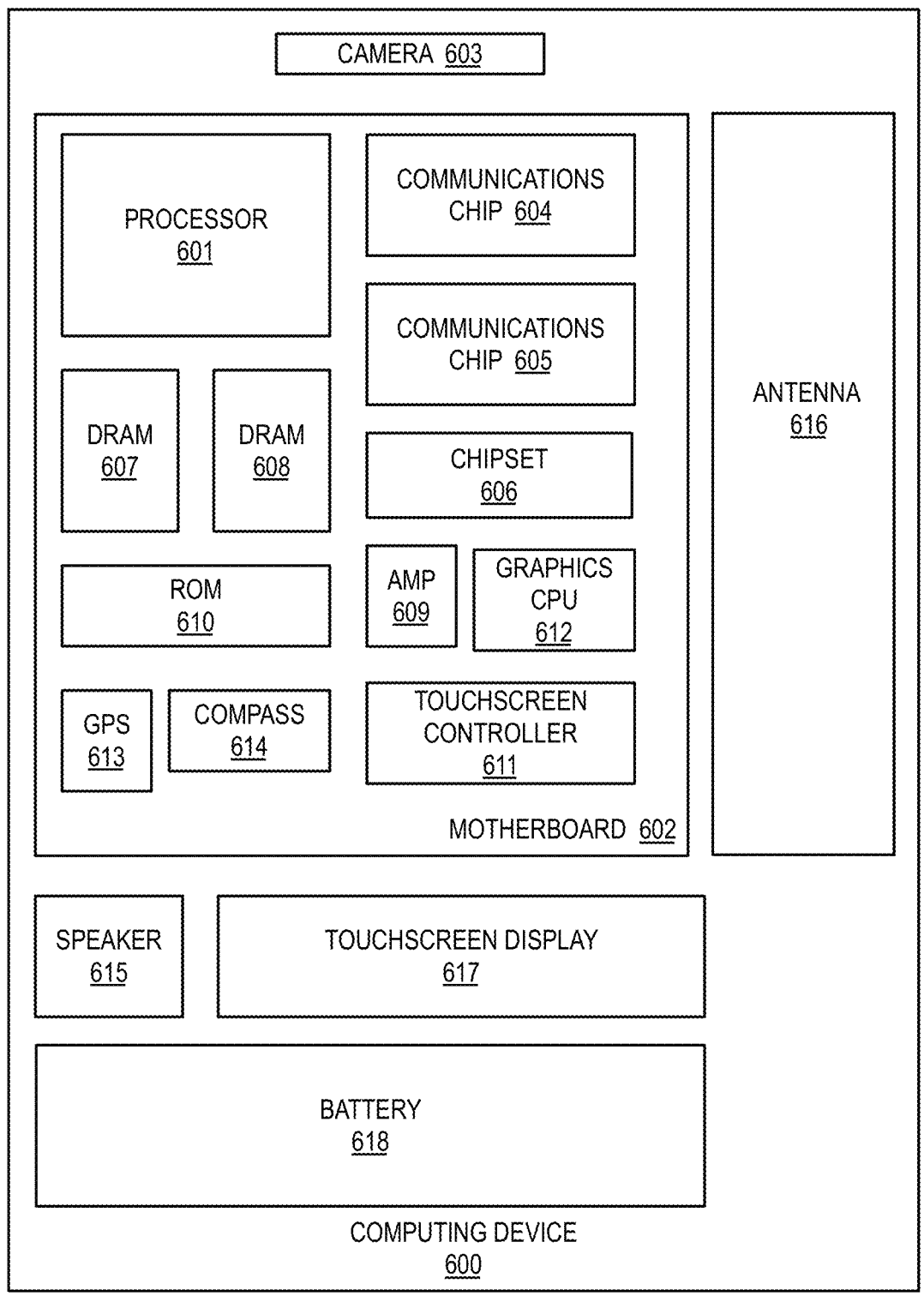
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 604 or 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communications chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes a system 500 including a transistor 106 with a recessed channel or body 108 coupled to a metallization structure 102, where the metallization structure 102 is further coupled an MOS transistor 501, (as described in association with FIG. 5. The integrated circuit die of processor 601 may further include interconnect structures, and non-volatile memory (NVM) devices such as magnetic tunnel junction and resistive random-access memory devices. The term "processor" may refer to any device or portion of a device that processes electronic data from registers and/or memory to transform that electronic data into other electronic data that may be stored in registers and/or memory.

Communications chip 605 also includes an integrated circuit die packaged within communication chip 605. In other embodiments, the integrated circuit die of communications chips 604, 605 include a device 100 including one or more transistors such as transistor 106, source contact 116 metallization structure 102 and device 104 (described in association with FIGS. 1A-1C, and 2A-2C). Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of NVM devices coupled with a transistor connected to external circuitry by one or more interconnect structures such as transistor 106 (described in association with FIGS. 1A-1C and 2A-2C). In an embodiment, the NVM devices may include spintronics based devices, magnetic tunnel junction devices, resistive random-access devices. In other embodiments two or three terminal spin orbit torque memory devices may be coupled with one or more transistors.

In various implementations, the computing device 600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
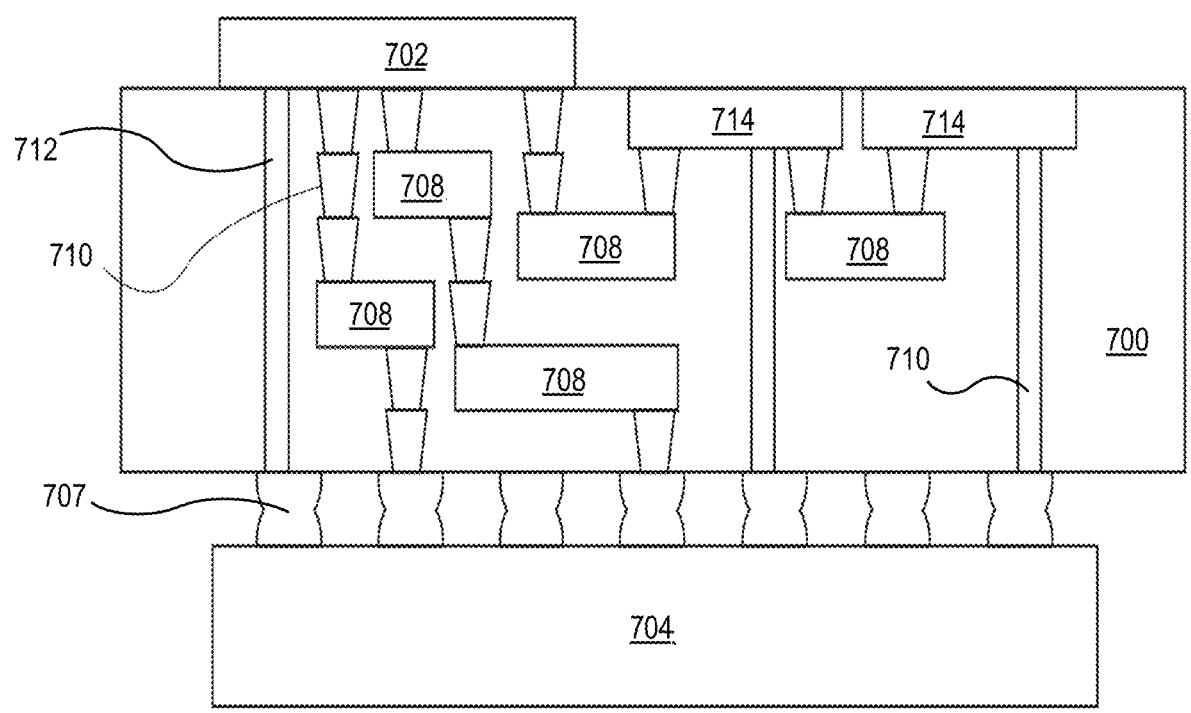
FIG. 7 illustrates an integrated circuit (IC) structure that includes one or more transistors and memory cells, all arranged in accordance with at least some embodiments of the present disclosure.

FIG. 7 illustrates an integrated circuit (IC) structure that includes one or more transistors and memory cells described in embodiments of the present disclosure. Integrated circuit (IC) structure 700 is an intervening substrate used to bridge a first substrate 702 to a second substrate 704. First substrate 702 may be, for instance, an integrated circuit die. Second substrate 704 may be, for instance, a memory module, a computer motherboard, or another integrated circuit die. In an embodiment, the integrated circuit die includes one or more transistors, such as transistor 106 including a recessed body 108, as described in association with FIGS. 1A-1C and 2A-2C above. The transistor may be part of a system 500 including a transistor 106 with a recessed body 108, where the transistor 106 is coupled to an MOS transistor 501 through a metallization structure 102, such as is described above in association with FIG. 5.

Referring again to FIG. 7, generally, the purpose of an integrated circuit (IC) structure 700 is to spread a connection to a wider pitch or to reroute a connection to a different connection. For example, integrated circuit (IC) structure 700 may couple an integrated circuit die to a ball grid array (BGA) 707 that can subsequently be coupled to second substrate 704. In some embodiments, first and second substrates 702, 704 are attached to opposing sides of integrated circuit (IC) structure 700. In other embodiments, the first and second substrates 702, 704 are attached to the same side of integrated circuit (IC) structure 700. And in further embodiments, three or more substrates are interconnected by way of integrated circuit (IC) structure 700.

Integrated circuit (IC) structure 700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

Integrated circuit (IC) structure 700 may include metal interconnects 708 and vias 710, including but not limited to through-silicon vias (TSVs) 712. Integrated circuit (IC) structure 700 may further include embedded devices 714, including both passive and active devices. Such devices include, but are not limited to, capacitors, decoupling capacitors, resistors, inductors, fuses, diodes, transformers, transistors including at least one peripheral device such as transistor 106, memory modules sensors, and electrostatic discharge (ESD) devices. More complex devices such as radiofrequency (RF) devices, power amplifiers, power management devices, antennas, arrays, sensors, and MEMS devices may also be formed on integrated circuit (IC) structure 700.

Accordingly, one or more embodiments of the present disclosure may relate generally to the fabrication of transistor devices for logic and embedded memory.

In a first example, a device includes a device level including a metallization structure coupled to a semiconductor device and a transistor above the device level. The transistor includes a body including a single crystal group III-V or a group IV semiconductor material. The transistor further includes a source structure on a first portion of the body and a drain structure on a second portion of the body, where the drain structure is separate from the source structure. A gate structure including a first portion is in a recess in the body and a second portion of the gate structure is between the drain structure and the source structure. The transistor further includes a first contact coupled with the source structure and a second contact structure coupled with the drain structure, where the first contact or the second contact is in contact with the metallization structure in the device level.

In second examples, for any of first example, the body includes a first dimension along a first direction away from a lowermost surface of the body, where the first dimension is at least 10 nm.

In third examples, for any of the first through second examples, the first gate structure portion in the body includes a semicircular shape and includes at most half the first dimension as measured from an uppermost surface of the body, where the gate structure portion has a lateral dimension in a second direction orthogonal to the first direction and where the lateral dimension is at least 30 nm.

In fourth examples, for any of the first through third examples, the first portion of the gate electrode extends laterally under a portion of the source structure or under a portion of the drain structure and where the first portion of the gate electrode has a lateral dimension along the second direction that is greater than a lateral dimension of the second portion of the gate electrode along the second direction.

In fifth examples, for any of the first through fourth examples, the device further includes a dielectric spacer on a portion of the source structure and on a portion of the drain structure, where the second portion of the gate structure is directly adjacent to the source structure and the drain structure, and where the gate structure further includes a third portion on the second portion of the gate structure, where the third portion is directly adjacent to and between the dielectric spacer on the portion of the source structure and the dielectric spacer on the portion of the drain structure.

In sixth examples, for any of the first through fifth examples, the dielectric spacer has a thickness between 2 nm and 10 nm.

In seventh examples, for any of the first through sixth examples, the device further includes a dielectric spacer on a portion of the body between the source structure and the second portion of the gate structure and on a portion of the body between the drain structure and the second portion of the gate structure.

In eighth examples, for any of the first through seventh examples, the gate structure includes a gate dielectric layer adjacent to the body and adjacent to the source structure and drain structure and a gate electrode adjacent to the gate dielectric layer.

In ninth examples, for any of the first through eighth examples, the gate dielectric layer has a thickness that is less than 2 nm.

In tenth examples, for any of the first through ninth examples, the source structure and the drain structure each includes a first region directly adjacent to the body, where the first region includes no dopants and a second region above the first region where the second region includes a dopant.

In eleventh examples, for any of the first through tenth examples, the dopant includes phosphorus, arsenic or boron.

In twelfth examples, for any of the first through eleventh examples, the dopant concentration in the second region is between 2e20-1e21 atoms/cm^3, where the first region has a thickness as measured from an uppermost surface of the body and where the thickness is no more than 10 nm.

In thirteenth examples, for any of the first through twelfth examples, the first contact structure or the second contact structure is in contact with at least one sidewall of the body, extending along a direction from a lowermost surface of the body to an uppermost surface of the body, and where the first contact structure or the second contact structure is in further contact with an uppermost surface of the metallization structure.

In a fourteenth example, for any of the first through thirteenth examples, the device further includes an isolation layer between the transistor and the metallization structure.

In fifteenth examples, for any of the first through fourteenth examples, the metallization level further includes at least one or more metallization levels between the semiconductor device and the metallization structure.

In sixteenth examples, a method of fabricating a device includes preparing a first substrate, where the preparing includes forming a first device above a first substrate, forming a metallization structure in a first dielectric, where the metallization structure is coupled with the first device and forming a first isolation layer on the metallization structure. The method further includes preparing a second substrate by forming a second isolation layer on the second substrate and bonding the first substrate with the second substrate by bringing into contact the uppermost surface of the first isolation layer with an uppermost surface of the second isolation layer. The method further includes forming an epitaxial semiconductor material on the second substrate and patterning the epitaxial semiconductor material and second substrate to form a body including a patterned epitaxial semiconductor material and a channel. The method further includes forming a dummy gate on the patterned epitaxial semiconductor material and forming an opening in a portion of the patterned epitaxial semiconductor material and a recess in the channel. The method further includes forming a gate structure in the opening and in the recess, forming a first contact structure on a portion of the patterned epitaxial semiconductor material, where the first contact structure extends to the metallization structure, forming a second contact on the drain structure and forming a gate contact on the gate structure.

In seventeenth examples, for any of the sixteenth example, forming the recess includes laterally etching the channel under the epitaxial semiconductor material.

In eighteenth examples, for any of the sixteenth example through seventeenth examples, forming the epitaxial semiconductor material includes an epitaxial growth process where no dopant is introduced during a first growth phase and where dopants are introduced in a second growth phase.

In nineteenth examples, a system includes a processor and a radio transceiver coupled to the processor, where the transceiver includes a first transistor. The first transistor includes a first drain contact coupled to a drain, a first source contact coupled to a source and a gate contact coupled to a gate. The system further includes a second transistor above the first transistor, where the second transistor includes a body including a single crystal group III-V, group IV semiconductor material and a source structure on a first portion of the body and a drain structure on a second portion of the body, where the drain structure is separate from the source structure. The second transistor further includes a gate structure including a first portion in a recess in the body and a second portion between the drain structure and the source structure. The second transistor further includes a second source contact coupled with the source structure and a second drain contact coupled with the drain structure, where the second source contact or the second drain contact is in contact with a metallization structure coupled to the first transistor.

In twentieth example, for any of the nineteenth examples, the system further includes a battery coupled to power at least one of the processor or memory.

What is claimed is:

1. A device, comprising:
   a metallization structure coupled to a semiconductor device; and
   a transistor above the metallization structure, the transistor comprising:
      a body comprising a semiconductor material;
      a source structure on a first portion of the body and a drain structure on a second portion of the body; and
      a gate structure comprising a first portion in a recess in the body and a second portion between the source structure and the drain structure;
      a first contact coupled with the source structure or the drain structure, wherein the first contact is in contact with the metallization structure; and
      a dielectric spacer on and in contact with a portion of the body between the gate structure and the source structure or the drain structure.

2. The device of claim 1, wherein the first portion of the gate structure in the recess comprises not more than half of a thickness of the body.

3. The device of claim 2, wherein the thickness of the body is not less than 10 nm, and wherein the first portion of the gate structure has a lateral dimension orthogonal to the thickness of not less than 30 nm.

4. The device of claim 1, wherein the first portion of the gate structure extends laterally under a portion of the source structure or the drain structure.

5. The device of claim 1, further comprising a dielectric spacer on a portion of the source structure or the drain structure, wherein the second portion of the gate structure is directly adjacent to the source structure or the drain structure, and wherein the gate structure further comprises a third portion on the second portion, wherein the third portion is directly adjacent to the dielectric spacer.

6. The device of claim 1, wherein the source structure and the drain structure each comprise a first region directly adjacent to the body, wherein the first regions comprise no dopants and a second regions above the first regions comprise a dopant.

7. The device of claim 1, wherein the first contact is in contact with a sidewall of the body and an uppermost surface of the metallization structure.

8. The device of claim 1, further comprising:
   a processor; and
   a transceiver coupled to the processor, wherein the transceiver or the processor comprises the metallization structure, the semiconductor device, and the transistor.

9. A device, comprising:
   a metallization structure coupled to a semiconductor device; and a transistor above the metallization structure, the transistor comprising:
- a body comprising a semiconductor material;
- a source structure on a first portion of the body and a drain structure on a second portion of the body; and
- a gate structure comprising a first portion in a recess in the body and a second portion between the source structure and the drain structure; and
- a first contact coupled with the source structure or the drain structure, wherein the first contact is in contact with the metallization structure, wherein the first contact is in contact with a sidewall of the body and an uppermost surface of the metallization structure.

10. The device of claim 9, wherein the first portion of the gate structure in the recess comprises not more than half of a thickness of the body.

11. The device of claim 10, wherein the thickness of the body is not less than 10 nm, and wherein the first portion of the gate structure has a lateral dimension orthogonal to the thickness of not less than 30 nm.

12. The device of claim 9, wherein the first portion of the gate structure extends laterally under a portion of the source structure or the drain structure.

13. The device of claim 9, further comprising a dielectric spacer on a portion of the source structure or the drain structure, wherein the second portion of the gate structure is directly adjacent to the source structure or the drain structure, and wherein the gate structure further comprises a third portion on the second portion, wherein the third portion is directly adjacent to the dielectric spacer.

14. The device of claim 9, wherein the source structure and the drain structure each comprise a first region directly adjacent to the body, wherein the first regions comprise no dopants and a second regions above the first regions comprise a dopant.

15. The device of claim 9, further comprising:
- a processor; and
- a transceiver coupled to the processor, wherein the transceiver or the processor comprises the metallization structure, the semiconductor device, and the transistor.

16. A device, comprising:
- a metallization structure coupled to a semiconductor device below the metallization structure; and
- a transistor above the metallization structure, the transistor comprising:
  - a body comprising a single crystal group III-V or group IV semiconductor material;
  - a source structure on a first portion of the body and a drain structure on a second portion of the body; and
  - a gate structure comprising a first portion in a recess in the body and a second portion between the source structure and the drain structure, wherein the first portion of the gate structure extends laterally under a portion of the source structure or the drain structure; and
  - a first contact coupled with the source structure or the drain structure, wherein the first contact is coupled to the metallization structure.

17. The device of claim 16, wherein the first portion of the gate structure in the recess comprises not more than half of a thickness of the body, wherein the thickness of the body is not less than 10 nm, and wherein the first portion of the gate structure has a lateral dimension orthogonal to the thickness of not less than 30 nm.

18. The device of claim 16, further comprising a dielectric spacer on a portion of the source structure or the drain structure, wherein the second portion of the gate structure is directly adjacent to the source structure or the drain structure, and wherein the gate structure further comprises a third portion on the second portion, wherein the third portion is directly adjacent to the dielectric spacer.

19. The device of claim 16, further comprising:
- a processor; and
- a transceiver coupled to the processor, wherein the transceiver or the processor comprises the metallization structure, the semiconductor device, and the transistor.

* * * * *